US006821704B1

(12) United States Patent
Ide et al.

(10) Patent No.: US 6,821,704 B1
(45) Date of Patent: Nov. 23, 2004

(54) THERMOSENSIBLE PLATE MATERIAL FOR FORMING LITHOGRAPHY AND METHOD FOR PREPARING THE SAME, LIQUID THERMOSENSIBLE PLATE MATERIAL FOR FORMING LITHOGRAPHY, AND LITHOGRAPHY

(75) Inventors: Youichiroh Ide, Fuji (JP); Hironobu Shirataki, Fuji (JP); Kei Tomeba, Fuji (JP); Taro Suzuki, Fuji (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 0 days.

(21) Appl. No.: 09/958,955

(22) PCT Filed: Apr. 14, 2000

(86) PCT No.: PCT/JP00/02459

§ 371 (c)(1), (2), (4) Date: Oct. 15, 2001

(87) PCT Pub. No.: WO00/63026

PCT Pub. Date: Oct. 26, 2000

(30) Foreign Application Priority Data

Apr. 15, 1999 (JP) .......................................... 11/107525
Jul. 7, 1999 (JP) .......................................... 11/192791

(51) Int. Cl.$^7$ ................................................ G03F 7/004

(52) U.S. Cl. ..................... 430/270.1; 430/138; 101/453

(58) Field of Search ............................. 430/138, 270.1, 430/271.1, 281.1, 286.1, 287.1, 288.1, 302, 348, 495.1, 944, 945, 964; 101/453–459, 463.1, 465, 466, 467

(56) References Cited

U.S. PATENT DOCUMENTS

| | | | | |
|---|---|---|---|---|
| 4,034,183 A | | 7/1977 | Uhlig | 219/122 |
| 4,063,949 A | | 12/1977 | Uhlig et al. | 96/27 E |
| 6,171,748 B1 | * | 1/2001 | Tanaka et al. | 430/138 |

FOREIGN PATENT DOCUMENTS

| | | | | |
|---|---|---|---|---|
| EP | 646476 A1 | | 4/1995 | |
| EP | 949088 A1 | | 10/1999 | |
| EP | 1 172 229 A1 | * | 1/2002 | B41N/1/14 |
| JP | 62-164049 A | | 7/1987 | |
| JP | 62-164596 A | | 7/1987 | |
| JP | 63-064747 A | | 3/1988 | |
| JP | 1-113290 A | | 5/1989 | |
| JP | 3-108588 A | | 5/1991 | |
| JP | 5-8575 A | | 1/1993 | |
| JP | 7-1849 A | | 1/1995 | |
| JP | 7-1850 A | | 1/1995 | |
| JP | 10-6468 A | | 1/1998 | |
| JP | 10-114168 A | | 5/1998 | |
| WO | WO 98/29258 | * | 7/1998 | B41N/1/14 |
| WO | WO 99-4974 | | 2/1999 | |

* cited by examiner

*Primary Examiner*—Barbara Gilliam
(74) *Attorney, Agent, or Firm*—Burns, Doane, Swecker & Mathis, L.L.P.

(57) ABSTRACT

A heat sensitive type plate material for forming lithography comprising a substrate (1) and, formed thereon, a heat sensitive layer (2), which in turn comprises a hydrophilic polymer (3) having a Lewis base moiety, lipophilic part forming particles (4) which form a lipophilic part on the surface of a plate through the change caused by heat, and polyvalent metal oxide particles (5), the lipophilic part forming particles (4) and the polyvalent metal oxide particles (5) being dispersed homogeneously in the heat sensitive layer (2). The plate material requires no developing process on forming a plate, and can form a lithography which has not only high mechanical strength, but also high printing durability, and further can be prepared with no significant increase of production cost.

12 Claims, 3 Drawing Sheets

Polyacrylic Acid

Polyacrylic Acid

THERMOSENSIBLE PLATE MATERIAL FOR FORMING LITHOGRAPHY AND METHOD FOR PREPARING THE SAME, LIQUID THERMOSENSIBLE PLATE MATERIAL FOR FORMING LITHOGRAPHY, AND LITHOGRAPHY

TECHNICAL FIELD

The present invention relates to heat sensitive type plate materials for use in making lithography and a method for preparing the same, to liquid heat sensitive materials for use in making the above plate materials, and to lithography made by the application of heat to the above plate materials.

BACKGROUND ART OF THE INVENTION

There have been proposed methods for making lithography using a computer. Particularly in the CTP (Computer-to-Plate) system, plate making is performed by printing print image information edited and produced by way of DTP (Desktop Publishing) directly on a plate material without any imaging processing, using a laser or thermal head. Much is expected from the CTP system in the field of commercial printing because it will enable the rationalization of plate making process, the reduction in time needed for plate making, and reduction in material cost.

In regard to plate materials for use in such CTP system, the present applicants propose heat sensitive plate materials on the plate surface (the surface an ink is put on at the time of printing) whose oleophilic area and non-ink-receptive area are formed by writing with heat according to the print image information, the heat sensitive plate materials being characterized in that they require no developing processing and provide lithography with excellent trait in durability of plate wear.

The lithography technology utilized by the plate making process from these plate materials, is used for, for example, printing using an oil-based ink, and plate surface formed at the time of plate making, of an oil-based-ink accepting area (oleophilic area) and an oil-based-ink rejecting area (hydrophilic area). At the time of printing, the ink is retained in the oleophilic area on the plate surface, and in the offset printing, the image corresponding to the oleophilic area on the plate surface is formed on paper by pressing the ink on the paper via a rubber blanket.

For example, Japanese Patent Laid-Open No. 7-1849 discloses a heat sensitive material for use in plate material which contains microcapsules with a component (oleophilic component) used to form an oleophilic area (image area) and a hydrophilic polymer (a hydrophilic binder polymer). The hydrophilic polymer includes a functional group capable of three-dimensionally crosslinking and a functional group reacting and combining with the oleophilic component in the microcapsules after the application of heat fractures the microcapsules.

The same specification also discloses a plate material produced by forming a heat sensitive layer (hydrophilic layer) consisting of the above described heat sensitive material on the surface of a support and then discloses the process of three-dimensionally crosslinking the hydrophilic polymer. According to the specification, this plate material is constructed in such a manner that the oleophilic component in the microcapsules forms a polymer and becomes an oleophilic area (an image area) once the microcapsules are fractured by heat during plate making, and at the same time, the oleophilic component reacts and combines with the hydrophilic polymer.

And according to the specification, with such construction, the plate material allows the plate making operation to eliminate developing process, and the lithography thus obtained is markedly excellent not only in plate wear durability but also in the quality of the hydrophilic area (non-image area). This results in clearly printed articles free from scumming layer.

WO (international publication) 98/29258 specification discloses a method of further enhancing the plate wear durability of the plate materials described in Japanese Patent Laid-Open No. 7-1849 in which the three-dimensional crosslinking of the hydrophilic polymer is formed by Lewis base moieties containing nitrogen, oxygen or sulfur interacting with polyvalent metal ions, such as tin.

The same specification also describes a method of stabilizing the hydrophilic area (non-image area) on the plate surface as well as preventing dirt from adhering to the plate surface by forming a hydrophilic polymer thin film layer, as a protective agent, on the surface of a heat sensitive layer (hydrophilic layer).

Therefore, in the above-mentioned specifications, plate materials utilizing lithography which do not require the developing processing and are excellent in plate wear durability as well as in enhancing the performance of the hydrophilic area (oil-based-ink non-receptive area, non-image area) can be obtained, as described above. These plate materials, however, leave much to be desired in terms of the mechanical strength and plate wear durability (especially preventing dirt from accumulating in the hydrophilic area) of lithography technology utilizing the plate making as described.

If the mechanical strength of a lithography is not satisfactorily high, scratches can easily result on the plate surface, and therefore, much care should be used when handling the plate. Further, when doing printing under such severe conditions that the pressure between the plate of the printing press and the blanket is high, stripping can occur between the plate body (the heat sensitive layer portion of the plate material) and the support. As a result, even at the stage where a relatively small number of prints have been produced, the plate wear may deteriorate.

When dirt accumulates on the hydrophilic area, the ink can easily adhere to the non-image area on the surface of the blanket especially when printing under severe conditions as described above. When this occurs, the blanket needs to be cleaned frequently, in order to prevent the scumming effect on the printed articles. This, in effect, decreases the efficiency of printing operation.

According to the method described in the above WO 98/29258 specification, it is possible to improve the mechanical strength and plate wear of lithography; however, the method is time-consuming and labor-intensive because it requires the refining process or the long-term cleaning process, which means that the production costs become higher when mass-producing the lithography. In this respect, the method still has room for improvement.

WO 99/04974 specification describes a plate material which has a special hydrophilic layer on the support and thereby does not require the developing process and can be manufactured inexpensively and easily.

The hydrophilic layer consists of a crosslinked polymeric matrix which contains a colloid of special metal oxides or hydroxides and a material capable of becoming ink-receptive by the irradiation of highly intensive light and heat. The above special metals include, for example, beryllium, magnesium, aluminum, silicon, gadolinium, germanium, arsenic, indium, tin, antimony, tellurium, lead, bismuth and transition metals.

The same specification describes a need for the hydrophilic layer to be crosslinked in order to print for long periods. It also describes a need for the hydrophilic layer to retain sufficient water in order to make the developing process unnecessary. And it further describes the invention being claimed on the finding that the overcoat of a metal colloid crosslinked with a crosslinker containing ionic groups (for example, colloidal silica) retains water and improves the printing performance.

In the examples described in the specification, the hydrophilic layer of the plate material is formed by coating polyethylene terephthalate with the mixture containing 5% colloidal silica, 1% 3-aminopropyl triethoxy silane (silane coupling agent) and 2% carbon, followed by drying.

In the plate material described in the specification, the hydrophilic layer is considered to be crosslinked by the combination among the metal oxides and the dehydration condensation between the metal oxide and a silane coupling agent. In this method, however, since the crosslinking results from the condensation of hydrophilic groups such as OH groups, increasing the number of crosslinked points results in decreasing the number of hydrophilic groups. Thus, with the plate material described in this specification, it is difficult to obtain lithography excellent in both mechanical strength and plate wear durability.

Accordingly, the object of the present invention is to provide heat sensitive type plate materials for use in making lithography which do not require the developing process, the heat sensitive plate materials being characterized in that the lithography made of those materials are excellent in mechanical strength and plate wear durability. In addition, the improved plate making process does not involve a significant cost increase.

DISCLOSURE OF THE INVENTION

First Plate material

The present invention provides a heat sensitive type plate material for use in making lithography in which a heat sensitive layer supported by a support, containing fine particles change when heated, thereby forming an oleophilic area on a plate surface (hereinafter referred to as "oleophilic area forming particles") and a hydrophilic polymer consisting of an organic polymer. The heat sensitive type plate material is characterized in that the above hydrophilic polymer has Lewis base moieties containing nitrogen, oxygen or sulfur and the above heat sensitive layer contains a polyvalent metal oxide (a metal oxide with a valence of 2 or more) as a hardening agent for the hydrophilic polymer sulfur. Hereinafter this plate material shall be referred to as first plate material.

In this heat sensitive type plate material for use in making lithography, the hydrophilic polymer contained in the heat sensitive layer is insoluble in water in spite of its hydrophilic nature. Furthermore, the hardness of the hydrophilic polymer contained in the heat sensitive layer is stronger than that of the hydrophilic polymer contained in the heat sensitive layer without any polyvalent metal oxide.

The mechanism of producing the effects described above has not been clarified yet, however it can be presumed as described below. Although this presumption is based on the results of various analyses such as NMR and X-ray scattering, it is still at the level of presumption at present.

Generally, the surfaces of the metal oxide particles include portions at which metal atoms and/or oxygen atoms are exposed in the unsaturated state (in state where either valence is not saturated) and portions at which OH groups exist. And these exposed metal atoms and/or oxygen atoms as well as the OH groups function as crosslinkers to the hydrophilic polymer having Lewis base moieties. Particularly the OH groups form stable hydrogen bonds together with the Lewis base moieties of the hydrophilic polymer.

Thus the metal oxide particles, it can be presumed, become an effective crosslinker to the hydrophilic polymer.

The heat sensitive layer has difficulty containing the metal oxides with a valence of 1 in the non-ionic state. And even if the heat sensitive layer is allowed to contain them in the non-ionic state, the intermolecular attraction of the monovalent metal oxide particles, with which the particles are formed, is weak compared with that of the polyvalent metal oxide particles; therefore, they cannot be effective crosslinkers to the hydrophilic polymer. Accordingly, monovalent metal oxides are not used in the present invention.

For example, when the hydrophilic polymer having Lewis base moieties is polyacrylic acid and the metal oxide is aluminum oxide ($Al_2O_3$), the $Al_2O_3$ particles exist among a plurality of carboxyl groups (Lewis base) of the polyacrylic acid, as shown in FIG. 2. Furthermore, a plurality of OH groups existing on the surface of the $Al_2O_3$ particles form hydrogen bonds together with the carboxyl groups of the polyacrylic acid.

Thus, the polyacrylic acid is crosslinked with the $Al_2O_3$ particles. With this crosslinking, the hydrophilic nature of the Lewis base moieties does not deteriorate. As a result, the crosslinked polyacrylic acid becomes insoluble in water in spite of its hydrophilic nature and becomes harder than non-crosslinked polyacrylic acid. And even if the degree of crosslinking is high, the highly hydrophilic nature of the hydrophilic area is maintained.

Further, it can be presumed that polyvalent metal oxides adsorb the oleophilic component of the oleophilic area forming particles during the course of the plate making since they have high adsorbability, whereby the effects of enhancing the plate wear of the oleophilic area can be obtained.

Further, a satisfactory heat sensitive layer can be obtained without the refining processing or the long-term cleaning processing, unlike the case of a heat sensitive layer containing a polyvalent metal ion (a metal ion with a valence of 2 or more), by allowing it to contain a polyvalent metal oxide. Thus, with this first plate material, the lithography having high mechanical strength and plate wear can be manufactured without causing a significant cost rise.

Polyvalent Metal Oxides for Use in the First Plate Material

As for polyvalent metal oxides contained in the first plate material, compounds expressed by the chemical formula $M_xO_y$, where M is a metal or semi-metal atom with a valence of 2 or more, and hydrates of the metallic compounds ($M_xO_y.nH_2O$) can be used. In addition, peroxides, suboxides and double oxides of the metallic compounds can also be used. As to the double oxides, any one can be used as long as at least one of the metallic compounds forming the same is a polyvalent metal oxide. In other words, the double oxides consisting of a monovalent metallic oxide and a polyvalent-metallic oxide can also be used.

The metal and semi-metal atoms with a valence of 2 or more include, for example, Cu, Ag, Au, Mg, Ca, Sr, Ba, Be, Zn, Cd, Al, Ti, Si, Zr, Sn, V, Bi, Sb, Cr, Mo, W, Mn, Re, Fe, Ni, Co, Ru, Rh, Pd, Os, Ir, Pt and rare earth elements.

The concrete examples of the polyvalent metal oxides which can be used for the first plate material include, for example, silicon dioxide, aluminium oxide, titanium oxide, zirconium oxide, zinc oxide, manganese dioxide, tin oxide, titanium peroxide, magnesium oxide, molybdenum oxide, iron oxide, germanium oxide, vanadium oxide, antimony oxide and tungsten oxide. These polyvalent metal oxides may be used solely or in combination with one or more different types.

The polyvalent metal oxides suitably used for the first plate material include, for example, silicon dioxide, aluminium oxide, tin oxide, titanium peroxide and titanium oxide. The use of these polyvalent metal oxides is quite effective in making the hydrophilic polymer contained in the heat sensitive layer insoluble in water and hard.

The crystal structure of the polyvalent metal oxides is not particularly limited and it may be any one of the structures of, for example, rutile, anatase, cuprite, salt, CuO type, wurtzite, spinel, perovskite, corundum, $Sc_2O_3$ type, fluorite, antifluorite, $ReO_3$ type or ilmenite. The polyvalent metal oxides may also be amorphous.

In the heat sensitive layer of the first plate material, the polyvalent metal oxide exists in the form of particles. The average primary particle diameter of the metal oxide particles is preferably 1 $\mu$m or less, more preferably 0.1 nm or more and 100 nm or less. On the surface of the metal oxide particles, metal atoms and/or oxygen atoms may be exposed in the unsaturated state and OH groups may also exist.

In the heat sensitive layer of the first plate material, the polyvalent metal oxide is preferably dispersed in the fine particle state. The term "dispersed in the fine particle state" means that the primary particles are dispersed without forming higher-order particles or that, even though the primary particles aggregate to form higher-order particles, the diameter of the higher-order particles is smaller than a certain value and the higher-order particles are substantially out of contact with each other. When the primary particles aggregate to form higher-order particles, the average diameter of the higher-order particles shall be 1 $\mu$m or less, or 0.1 nm or more and 100 nm or less.

If the polyvalent metal oxide is not dispersed in the fine particle state in the heat sensitive layer, but forms an aggregate of three-dimensional network, the contact area of the hydrophilic polymer and the polyvalent metal oxide becomes small, whereby the effects as described above cannot sometimes be obtained satisfactorily.

In the heat sensitive layer of the first plate material, the content of the polyvalent metal oxide is preferably 1% by mass or more and 90% by mass or less per 100% by mass of the heat sensitive layer, more preferably 5% by mass or more and 80% by mass or less. If the content of the polyvalent metal oxide is too low, the effect of adding the polyvalent metal oxide cannot sometimes be produced satisfactorily; on the other hand, if the content of the polyvalent metal oxide is too high, satisfactory sensitivity cannot sometimes be obtained.

Heat sensitive Material for Use in First Plate Material

The present invention provides a liquid heat sensitive material for use in making lithography characterized in that it includes: fine particles that change when heated and thereby forming an oleophilic area on the plate surface; a hydrophilic polymer having Lewis base moieties containing nitrogen, oxygen or sulfur; a polyvalent metal oxide; and a stabilizer for making the polyvalent metal oxide inert to the above hydrophilic polymer.

The stabilizer is preferably an acid or a base. The acids and bases which can be used as the stabilizer include, for example, all the acids and bases defined by Brensted or Lewis. All the acids and bases defined by Brensted or Lewis are described in, for example, the Chemistry Society of Japan (ed.), *Handbook of Chemistry,* 4$^{th}$ Revised Edition, Basic Vol. II: 316–333, Maruzen Press, Tokyo, 1993. Of the acids and bases, preferably used are hydrogen chloride, nitric acid, ammonia, hydroxyamine, phosphoric acid, sulfuric acid, benzoic acid, formic acid and citric acid. Ammonia as a base stabilizer and hydrogen chloride as an acidic stabilizer are particularly preferably used since those stabilizers are easy to remove after the film formation.

It can be presumed that those stabilizers stabilize the polyvalent metal oxide (make the polyvalent metal oxide inert to the above hydrophilic polymer) in such a manner as described below.

For example, when the polyvalent metal oxide is aluminium oxide ($Al_2O_3$), hydrogen bonds are formed between H atoms of more than one OH group existing on the surface of an $Al_2O_3$ particle and N atoms of the ammonia added as the stabilizer, as show in FIG. 3. This, it is considered, makes it hard to produce mutual interactions between the hydrophilic polymer having Lewis base moieties and the polyvalent metal oxide particles.

As described above, the heat sensitive layer of the first plate material includes: fine particles changed when heated and thereby forming an oleophilic area on the plate surface (oleophilic area forming particles); a hydrophilic polymer having Lewis base moieties containing nitrogen, oxygen or sulfur; and polyvalent metal oxides. The processes for forming the heat sensitive layer include, for example, the following two. According to the first process, first a liquid heat sensitive material containing oleophilic area forming particles, a hydrophilic polymer and polyvalent metal oxides is prepared, then a support is coated with the liquid to form a coat thereon, and finally the solvent is evaporated from the coat.

According to the second process, a liquid heat sensitive material containing oleophilic area forming particles and a hydrophilic polymer, but without polyvalent metal oxides, is prepared, and coated on a support to form a coat thereon. Then the coat is allowed to contain a polyvalent metal oxide by, for example, introducing a liquid containing the polyvalent metal oxide penetrate into the coat, and after this, finally the solvent is evaporated from the coat.

Comparing these two processes, the first process is simpler and easier than the second process, and it is more preferable as a process for forming the heat sensitive layer when mass-producing the same. In the former process, however, since a polyvalent metal oxide and a hydrophilic polymer coexist in the heat sensitive material, they are likely to crosslink before the application of the material on a support. This may result in increase in viscosity of the heat sensitive material, partially hardening and gelling the hydrophilic polymer in the heat sensitive material and forming sediment in the heat sensitive material before the application of the material on the support.

On the other hand, the liquid heat sensitive material for making lithography according to the present invention includes a stabilizer for introducing the polyvalent metal oxides inert to the hydrophilic polymer; therefore, the polyvalent metal oxide and the hydrophilic polymer are prevented from crosslinking with each other before the application of the material on the support. Accordingly, in this heat sensitive material, the problems of increase in viscosity, partially hardening and gelling the hydrophilic polymer and forming sediment are inhibited from occurring during storage, as long as the storage duration is normal.

However, when storing the liquid heat sensitive material for a long period of time, the polyvalent metal oxide may be stored separately from the oleophilic area forming particles and the hydrophilic polymer, and it may be mixed with the liquid heat sensitive material, which contains all the components except the polyvalent metal oxide, just before applying the material on the support.

As the solvent for the heat sensitive material, a liquid must be used which is capable of dispersing and dissolving not only the oleophilic area forming particles and the hydrophilic polymer, but also the particulate polyvalent metal oxide. Therefore, water or a liquid whose main component is water is preferably used as the solvent. A mixed dispersion medium consisting of water and a water-soluble liquid may also be used. In order to adjust the viscosity, an organic solvent may be added to the heat sensitive material. The applicable organic solvents include, for example, methanol, ethanol, 2-propanol, 1-propanol, acetone and methyl ethyl ketone.

Some components in this heat sensitive material, may sometimes settle out during storage; however, the material may be used without causing any problems only by re-agitating it just before applying it on the support. Among the re-agitating methods, shaking within a closed vessel and rotary agitation with a rotating blade can be adopted, though the choice of method depends on the degree of the sediment.

Method of Preparing the First Plate Material

The present invention provides a method for preparing a heat sensitive type plate material for use in lithography, the heat sensitive plate material being characterized in that its heat sensitive layer is obtained by first applying the thermosenstive material of the present invention for use in making lithography on a support to form a coat and then removing the stabilizer from the coat. This method is suitable for preparing the first plate material.

According to this method, the polyvalent metal oxide and the hydrophilic polymer are prevented from crosslinking with each other before the application of the heat sensitive material on the support. Further, the hydrophilic polymer, which is contained in the heat sensitive layer obtained after removing the stabilizer, is made insoluble in water and hard due to the interactions with the polyvalent metal oxide.

The processes for removing the stabilizer from the coat include, for example, evaporating the stabilizer by heating the coat or leaving the same support at room temperature; cleaning the coat with a basic liquid when the stabilizer is an acid; and cleaning the coat with an acidic liquid when the stabilizer is a base. More than one process may be used in combination. Specifically, the stabilizer may be removed by first evaporating it and then cleaning the coat with a basic or acidic liquid. The evaporation of the stabilizer may be performed at atmospheric pressure or reduced pressure.

When removing the stabilizer from the coat by heating the same, the heating temperature must be within the range such that the heat does not destroy the characteristics of oleophilic area forming particles (for example, microcapsules) and the hydrophilic polymer contained in the heat sensitive material. The heating source used is not limited and ordinary electric ovens and infrared heating ovens can be used.

When removing the stabilizer from the coat by cleaning the same with a basic or acidic liquid, not only the liquid at room temperature but also the heated or cooled liquid can be used. The liquid temperature at the time of removing the stabilizer must be determined according to the bloating tendency and mechanical strength of the coat and the temperature characteristics of the oleophilic area forming particles so as to be within the range that does not destroy the satisfactory characteristics of the oleophilic area thereof.

When forming the heat sensitive layer of the heat sensitive type plate material for use in lithography by the second process, the coat previously formed is made to contain the polyvalent metal oxide in the dispersed state. In this case, the coat may contain a precursor, instead of the polyvalent metal oxide itself, which can be changed to the polyvalent metal oxide by carrying out treatments such as heating, moistening and aging. In such a case, the precursor is changed to the metal oxide within the coat by carrying out the above treatments. The precursor may be previously added to the heat sensitive material.

In order to make the previously formed coat contain the polyvalent metal oxide or the precursor thereof in the dispersed state, first an aqueous solution or dispersion containing the polyvalent metal oxide or the precursor thereof is made to penetrate into the coat (heat sensitive layer) from its surface. Then the solvent of the aqueous solution or the dispersion medium of the dispersion is evaporated from the coat.

The processes for making the above aqueous solution or dispersion penetrate into the coat include, for example, immersing the coat in the above aqueous solution or dispersion, spraying the aqueous solution or dispersion on the coat, and applying the aqueous solution or dispersion on the coat with a bar coater or a roll coater.

When making the heat sensitive layer containing more than one type of polyvalent metal oxides, the liquid may be prepared for each polyvalent metal oxide to treat the polyvalent metal oxides one by one, or the liquid containing all types of the polyvalent metal oxides is prepared to treat them collectively.

As the process for evaporating the solvent or the dispersion medium from the coat, any one of the processes, such as air-drying at room temperature, vacuum drying, and force-drying by heating with heated air or infrared rays, may be adopted. Depending on the situation, heat treatment may be carried out after air-drying at room temperature. However, when carrying out force-drying by heating, the heating temperature must be within the range of not destroying the characteristics of the oleophilic area forming particles (for example, microcapsules) and hydrophilic polymer contained in the thermosensitive layer.

Alternatively, the process may be such that first the support is coated with the polyvalent metal oxide or the precursor thereof, then the coat as described above is formed thereon, and finally treatments such as heating or aging is carried out to move the polyvalent metal oxide or the precursor thereof from the support to the heat sensitive layer and disperse the same.

Second Plate Material

The present invention provides a heat sensitive type plate material for use in making lithography in which a heat sensitive layer containing fine particles, which are changed when heated and thereby forming an oleophilic area on the plate surface, and a hydrophilic polymer is supported by a support, the heat sensitive type plate material being characterized in that the above hydrophilic polymer has Lewis base moieties containing nitrogen, oxygen or sulfur and the above heat sensitive layer contains a substance consisting of molecules having a bond expressed by the chemical formula $(SiO_2)_n$ (hereinafter the substance shall be referred to as "substance A") as a hardening agent for the hydrophilic polymer. This plate material shall be referred to as second plate material.

The above heat sensitive layer is easily allowed to contain this substance A in such a manner as to remove the solvent from the solution, in which at least one selected from the group consisting of lithium silicate, sodium silicate and potassium silicate is dissolved, while allowing the solution and the above hydrophilic polymer to coexist with each other. The solvents used are not limited as long as they can dissolve alkali metal salts of silicic acid; however, water is preferably used.

In other words, the heat sensitive layer of the second plate material is formed in such a manner as to remove the solvent from the solution, in which at least one selected from the group consisting of lithium silicate, sodium silicate and potassium silicate is dissolved, while allowing the solution and the hydrophilic polymer having Lewis base moieties containing nitrogen, oxygen or sulfur to coexist with each other, contains the substance A.

In this heat sensitive type plate material for use in lithography, the hydrophilic polymer contained in the heat sensitive layer is insoluble in water in spite of its hydrophilic nature. Also the hardness of the hydrophilic polymer contained in the heat sensitive layer is higher than that of the hydrophilic polymer contained in the heat sensitive layer without the substance.

Further, a satisfactory heat sensitive layer can be obtained without the refining process and the long-term cleaning process, unlike the case of a heat sensitive layer containing a polyvalent metal ion (a metal ion with a valence of 2 or more), by allowing it to contain a polyvalent metal oxide. Thus, with this second plate material, the lithography having high mechanical strength and plate wear can be manufactured without causing a significant cost increase.

The mechanism of producing the effects described above has not been clarified yet, however it can be presumed as described below. Although this presumption is based on the results of various analyses such as NMR and X-ray scattering, it is still at the level of presumption at present.

When removing water from the aqueous solution of alkali salts of silicic acid, the silicic acid ion moieties form a molecule having an alternating bond of silicon atoms and oxygen atoms. It can be presumed that this bond is expressed by the chemical formula $(SiO_2)_n$ and has a three-dimensional network in which quadrivalent silicon atoms and divalent oxygen atoms alternately bond to each other.

When removing water from the aqueous solution, in which an alkali salt of silicic acid is dissolved, while allowing the aqueous solution and the hydrophilic polymer having Lewis base moieties to coexist with each other, a chemical reaction occurs in which the hydrophilic polymer enters the three-dimensional network formed by the $(SiO_2)_n$ bond of the molecule constituting the substance A or in which the substance A and the hydrophilic polymer are complicated with each other (a special phase separation structure). The degree to which they go into each other is considered to be about a few nm to a few hundred nm.

Presumably, the above described states allow the hydrophilic polymer to become insoluble in water in spite of its hydrophilic nature and to become hard compared with the hydrophilic polymer contained in the heat sensitive layer without a molecule having the $(SiO_2)_n$ bond.

Further, the state in which the hydrophilic polymer enters the three-dimensional network formed by the $(SiO_2)_n$ bond allows the molecule having the $(SiO_2)_n$ bond to be exposed on the heat sensitive layer surface. This, it can be presumed, ensures the insolubility of the hydrophilic polymer in water and effectively improves the hydrophilic nature of the heat sensitive layer surface.

Further, since there exist OH groups at the ends of the $(SiO_2)_n$ bond, hydrogen bonds are formed among the OH groups and the Lewis base moieties of the hydrophilic polymer. These hydrogen bonds also contribute to the improvement in insolubility of the hydrophilic polymer in water and the increase in hardness of the same.

In the present invention, it does not matter whether or not chemical bonds including the above described hydrogen bonds are formed between the molecule having the above $(SiO_2)_n$ bond and the hydrophilic polymer, as long as the heat sensitive layer contains the substance comprising of the above molecule.

In the second plate material, the above heat sensitive material may contain the above described substance A in such a manner as to remove water from the liquid, which is achieved by mixing the above alkali metal salt, a water-soluble silicate, and a silicate which is hard to dissolve in water or is water-insoluble in the presence of water (water dispersion), while allowing the liquid and the hydrophilic polymer having Lewis base moieties to coexist with each other.

The silicates which are hard to dissolve in water or water-insoluble include, for example, silicates formed of Ca, Mg, Ba, Mn, Co, Fe, Al or Be and silicic acid and the hydrates thereof. These silicates can be used solely or in combination with one or more different types.

Silicates are salts formed of silicon dioxide and metal oxide, and the mixing ratio of silicon dioxide to metal oxide is not fixed. The silicates are classified into orthosilicate (nesosilicate), sorosilicate, cyclosilicate, inosilicate, metasilicate (single chain inosilicate) and phyllosilicate based on the structure.

The silicates used in the present invention may have any one of the above structures. And the silicates formed of 2 types of metals, such as potassium aluminum silicate, calcium aluminum silicate, sodium aluminum silicate, sodium calcium silicate and calcium magnesium silicate may also be used.

The particularly preferred silicates include, for example, lithium silicate, sodium silicate and potassium silicate. The use of these silicates particularly enhances the hydrophilic nature of the heat sensitive layer surface.

[Method for Forming the Heat Sensitive Layer of the Second Plate Material]

When allowing the heat sensitive layer to contain the above described substance A in the above described manner, the timing of allowing the aqueous solution or water dispersion of a silicate and the hydrophilic polymer to coexist with each other may be either before the formation of the heat sensitive layer on the support or after the formation of the heat sensitive layer, which does not contain the substance A yet, on the support.

When the above timing is before the formation of the heat sensitive layer on the support, first the silicate is added to a liquid heat sensitive material (a material containing the oleophilic area forming particles and the hydrophilic polymer). After that, the support is coated with the heat sensitive material, followed by evaporating the solvent, and thus a state is brought in which the formed heat sensitive layer contains the substance A.

In this case, the amount of the silicate added to the heat sensitive material is preferably 5 to 300 parts by mass (parts by mass of the silicate dissolved in the aqueous solution, even when adding the aqueous solution of the silicate) per 100 parts of hydrophilic polymer, more preferably 10 to 150 parts by mass per 100 parts of hydrophilic polymer. Even though the silicate is added, the coating process for forming the heat sensitive layer is not necessarily changed and the ordinary processes can be adopted. Any one of the applicators such as bar coater, roll coater and die coater may be used as the coating applicator.

As the process for evaporating the solvent from the coat of the heat sensitive material, any one of the processes, such as air-drying at room temperature, vacuum drying, and force-drying by heating with heated air or infrared rays, may be adopted. However, when carrying out force-drying by heating, the heating temperature must be within the range that does not destroy the characteristics of the oleophilic area forming particles (for example, microcapsules) and hydrophilic polymer contained in the thermosensitive material.

When the above timing is after the formation of the heat sensitive layer, which does not contain the substance A yet, on the support, a coat is formed by first coating the support with a liquid heat sensitive material without the above substance and then evaporating the solvent. Then the above described aqueous solution or dispersion of a silicate is allowed to penetrate into the coat from the surface thereof. After that, if the solvent of the aqueous solution or the dispersion medium of the dispersion is evaporated from the coat, the resulting coat contains the substance A. Thus, a heat sensitive layer containing the substance A can be obtained.

The processes for allowing the above aqueous solution or dispersion to penetrate into the above coat include, for example, immersing the coat in the above aqueous solution or dispersion, spraying the aqueous solution or dispersion on the coat, and applying the aqueous solution or dispersion on the coat with a bar coater or a roll coater.

In this case, the amount of the silicate contained in the above aqueous solution or dispersion is preferably 0.01 to 30 parts by mass per 100 parts of aqueous solution or dispersion, more preferably 0.1 to 5 parts by mass per 100 parts of aqueous solution or dispersion.

As for the process for evaporating the above solvent or dispersion from the coat, just like the process for evaporating the solvent from the heat sensitive material, any one of the above described processes may be adopted.

The processes for allowing the heat sensitive layer to contain the above described substance A include another one in which the above aqueous solution or dispersion is moved from the support to the heat sensitive layer, which does not contain the above substance yet, and is allowed to penetrate into the same. In this process, the support is previously coated with the above aqueous solution or dispersion of silicate. Then the above heat sensitive layer is formed on the surface of the coat, and the above aqueous solution or dispersion is moved from the support to the heat sensitive layer by way of heating or aging.

In this case, the amount of the silicate contained in the above aqueous solution or dispersion is preferably 0.01 to 60 parts by mass per 100 parts of aqueous solution or dispersion, more preferably 0.1 to 50 parts by mass per 100 parts of aqueous solution or dispersion. The process for forming the heat sensitive layer is not necessarily changed in this case, either, and the coating processes using the above coating applicators and the solvent evaporating processes can be adopted. However, in order to allow the aqueous solution or dispersion of silicate to fully penetrate into the heat sensitive layer, preferably the evaporation of the solvent is carried out 30 seconds or more after the formation of the coat of the heat sensitive layer.

For the silicate containing liquid (aqueous solution or water dispersion) used in each of the above processes, if the pH value is too high, the effects cannot sometimes be shown which should be produced by allowing the heat sensitive layer to contain the substance A. Therefore, the liquid may sometimes be allowed to penetrate into the above coat after adjusting its pH to a proper range by adding mineral acid or organic acid thereto.

Third Plate Material

Preferably the heat sensitive layer of the second plate material further contains a polyvalent metal oxide. The second plate material whose heat sensitive layer contains a polyvalent metal oxide shall be referred to as third plate material. In other words, the heat sensitive layer of the third plate material contains a substance consisting of molecules having a $(SiO_2)_n$ bond (a substance A) and a polyvalent metal oxide as a hardening agent for the hydrophilic polymer.

The polyvalent metal oxides used in the third plate material include those exemplified in the section of the aforementioned first plate material. They also include the aforementioned water-insoluble silicates and the hydrates thereof.

Of the polyvalent metal oxides, a metal oxide using at least one selected from the group consisting of silicon dioxide, aluminium oxide, tin oxide, titanium peroxide and titanium oxide is particularly preferable. The use of these polyvalent metal oxides is quite effective in making the hydrophilic polymer contained in the heat sensitive layer insoluble in water.

It can be presumed that, when allowing the heat sensitive layer to contain the substance A in the aforementioned manner, if a polyvalent metal oxide exists, a stronger three-dimensional network results when the silicic acid ion moieties are changed and thereby a molecule having a $(SiO_2)_n$ bond is formed. As shown in FIG. 4, this result is due to the fact that the molecule is being crosslinked with the polyvalent metal oxide. As a result, the hydrophilic polymer contained in the heat sensitive layer becomes much more insoluble in water and the hardness of the same becomes higher. FIG. 4 shows the case where the polyvalent metal oxide is aluminium oxide ($Al_2O_3$) particles.

Further, unlike the case of a heat sensitive layer containing a polyvalent metal ion (a metal ion with a valence of 2 or more), by allowing it to contain a polyvalent metal oxide a satisfactory heat sensitive layer can be obtained without the refining process and the long-term cleaning process. Thus, with this third plate material, the lithography having high mechanical strength and plate wear can be manufactured without causing a significant cost increase.

In the heat sensitive layer of the third plate material, the polyvalent metal oxide exists in the form of particles, like the case of the first plate material. The average primary particle diameter of the metal oxide particles is preferably 2 μm or less, more preferably 0.1 nm or more and 500 nm or less.

In the heat sensitive layer of the third plate material, the polyvalent metal oxide is preferably dispersed in the fine particle state, like the case of the first plate material. When the primary particles aggregate to form higher-order particles, the average diameter of the higher-order particles shall be 2 μm or less, or 0.1 nm or more and 500 nm or less.

It is preferable that the polyvalent metal oxide is dispersed in the fine particle state in the heat sensitive layer, and does not form an aggregate of three-dimensional network. If the polyvalent metal oxide is not dispersed when each of the silicic ion moieties are changed to form a molecule having a $(SiO_2)_n$ bond, the contact area of the molecule and the polyvalent metal oxide becomes small, whereby the effects produced by the crosslinking between the molecule and the polyvalent metal oxide cannot be obtained satisfactorily.

Method for Forming the Heat sensitive Layer of the Third Plate Material

The methods for forming the heat sensitive layer of the third plate material include, for example, those of (1) to (5) described below:

(1) A coat consisting of a heat sensitive material which contains polyvalent metal oxide particles and a stabilizer, but a substance A is not formed on a support and an aqueous solution of a silicate is allowed to penetrate into the coat. Then the stabilizer and water, as a solvent, are evaporated from the coat.

(2) First, polyvalent metal oxide particles are added to a heat sensitive material with an aqueous solution of silicate added thereto, which is used when forming the heat sensitive layer of the second plate material. Then a support is coated with the heat sensitive material to form a coat and the solvent or the dispersion medium is evaporated from the coat. In this case, the amount of the polyvalent metal oxide added is, for example, 0.5 to 300 (preferably 10 to 100) parts by mass per 100 parts of silicate.

(3) A polyvalent metal oxide in the form of particles is added to the heat sensitive material of the second plate material using the second process shown in the section of the first plate material.

(4) A coat consisting of a heat sensitive material which contains neither substance A nor polyvalent metal particles is formed on a support and a liquid containing a silicate and a polyvalent metal oxide (or a precursor of a polyvalent metal oxide) in the form of particles is allowed to penetrate into the coat. Then the solvent or the dispersion medium is evaporated from the coat. When using a precursor, a certain treatment is carried out. As to the treatment, refer to the section in which the method of preparing the first plate material is described.

(5) A support is coated with a liquid containing a silicate and a polyvalent metal oxide (or a precursor of polyvalent metal oxide) in the form of particles in advance, the above described coat is formed on the coated surface, and the above liquid is allowed to penetrate into the coat from the support.

Fourth Plate Material

The present invention provides a heat sensitive type plate material for use in making lithography in which a heat sensitive layer containing fine particles, which is changed when heated, forms an oleophilic area on the plate surface, and a hydrophilic polymer supported by a support. The heat sensitive plate material is characterized in that the above hydrophilic polymer has Lewis base moieties containing nitrogen, oxygen or sulfur and the above heat sensitive layer contains a silicate. This plate material shall be referred to as a fourth plate material.

In this heat sensitive type plate material to be used in lithography, the hydrophilic polymer contained in the heat sensitive layer is insoluble in water in spite of its hydrophilic nature. And the hardness of the hydrophilic polymer contained in the heat sensitive layer is higher than that of the hydrophilic polymer contained in the heat sensitive layer without a silicate.

Further, a satisfactory heat sensitive layer can be obtained without the refining processing and the long-term cleaning processing, unlike the case of a heat sensitive layer containing a polyvalent metal ion (a metal ion with a valence of 2 or more). Thus, with this fourth plate material, the lithography having high mechanical strength and plate wear can be manufactured without causing a significant cost rise.

The mechanism of producing the effects described above has not been clarified yet. However it can be presumed as described below. Although this presumption is based on the results of various analyses such as NMR and X-ray scattering, it is still at the level of presumption at present.

If there exists a silicate together with a hydrophilic polymer having Lewis base moieties in the heat sensitive layer, the ends of the silicate and the Lewis base moieties of the hydrophilic polymer form some bond, whereby the hydrophilic polymer is crosslinked with the silicate. The bond is considered to be, for example, a hydrogen bond.

Any type of silicates can be used in the fourth plate material. The concrete examples of silicates are described in the section of the second plate material. Of these silicates, the silicates whose silicic acid ion has 2 or more silicon atoms are preferably used. Further, the silicates including at least an alkali salt of silicic acid are preferably used. The use of these preferable silicates provides much more effective heat sensitive layer and/or easier manufacturing of the plate material.

Preferably this fourth plate material contains a polyvalent metal oxide, just like the first and second plate materials.

The heat sensitive layer of the fourth plate material can be formed by, for example, the method described in the section of the second plate material. In other words, the heat sensitive layer is formed in such a manner as to remove the solvent from the solution, in which at least one selected from the group consisting of lithium silicate, sodium silicate and potassium silicate is dissolved, while allowing the solution and the hydrophilic polymer having Lewis base moieties which contain nitrogen, oxygen or sulfur to coexist with each other generally contains a silicate itself as well as the above described substance A. Accordingly, the heat sensitive layer formed by the method is the heat sensitive layer of not only the second plate-material but also the fourth plate material.

Others

As described above, the plate materials of the present invention are heat sensitive plate materials for use in making lithography in which a heat sensitive layer containing fine particles, which are changed when heated and thereby forms an oleophilic area on the plate surface, and a hydrophilic polymer is supported by a support. The heat sensitive plate materials is characterized in that the above hydrophilic polymer has Lewis base moieties containing nitrogen, oxygen or sulfur and the above heat sensitive layer contains at least any one of a polyvalent metal oxide, the above described substance A and a silicate.

The liquid heat sensitive material of the present invention is characterized in that it contains a polyvalent metal oxide and the above described stabilizer. Furthermore, the method for preparing a plate material of the present invention is characterized in that it includes the steps of: forming a coat on a support using the liquid heat sensitive material of the present invention; and removing the stabilizer from the coat.

Accordingly, as for the constructions (the construction and material of the oleophilic area forming particles, the protective agent, the other components the heat sensitive layer can contain, and the material and structure of the support), which are related to the plate materials, the method for preparing the same and the liquid heat sensitive material of the present invention, other than the above described characteristics and the method for making plates by heat, the known conventional technologies and the technologies described in the specification of patent applications (patent application WO 98/29258 specification filed by the present applicants) can be adopted.

The Lewis base moieties of the hydrophilic polymer include, for example, functional groups containing nitrogen, oxygen or sulfur and nitrogen heterocycles. The examples of the functional groups forming the Lewis base moieties will be shown below:

Carboxyl group, phosphoric group, sulfonic group and amino group, and the salts thereof (namely, the groups in which hydrogen atoms are replaced with metals). Amide group, monoalkylamino group, dialkylamino group and trialkylamino group. Isoureido group, isothioureido group, imidazolyl group, ureido group, imino group, epimino group, ureylene group, oxamoyl group, oxalo group and oxalaceto group.

Carbazoyl group, carbazolyl group, carbamoyl group, carboxylato group, carboimidoyl group, carbonohydrazide group, quinolyl group, guanidino group, sulfamoyl group, sulfanamoyl group, sulfoamino group, semicarbazide group, semicarbazono group, thioureido group, thiocarbamoyl group, triazano group, triazeno group, hydrazino group, hydrazo group, hydrazono group, hydroxyamino group, hydroxyimino group, formimidoyl group, formamide group, 3-morpholinyl group and morpholino group.

The percentage of the Lewis base moieties in the hydrophilic polymer is preferably set at 1% or more per number of monomer units of the whole hydrophilic polymer, to obtain the effects of adding the polyvalent metal oxide. Higher the percentage, larger the effects; however, the upper limit of the percentage shall be, for example, 400% or less. In order to specially enhance the mechanical strength of the heat sensitive layer of the plate material and obtain high sensitivity at the time of plate making, the above percentage is preferably 50% or more and 100% or less.

The hydrophilic polymers having Lewis base moieties include, for example, organic polymers having Lewis base moieties and a carbon skeleton. When the Lewis base moieties of the hydrophilic polymer are of hydrophilic groups, the hydrophilic polymer needs not always contain a hydrophilic group other than the Lewis base moieties.

The concrete examples of hydrophilic polymers having Lewis base moieties include, for example, homopolymers or copolymers synthesized with one or more types of hydrophilic monomers. And the examples of the hydrophilic monomers will be shown below:

(Meth)acrylic acid, and the alkali metal salts and amine salts thereof. Itaconic acid, and the alkali metal salts and amine salts thereof. (Meth)acrylamide, N-monomethylol (meth)acrylamide, N-dimethylol (meth)acrylamide, allylamine and the hydrohalide salts thereof. 3-vinylpropionic acid, and the alkali metal salts and amine salts thereof. Vinylsulfonic acid, and the alkali metal salts and amine salts thereof.

2-sulfoethyl (meth)acrylate, polyoxyethylene glycol mono(meth)acrylate, 2-acrylamide-2-methylpropane sulfonic acid, acid phosphoxypolyoxyethylene glycol mono (meth)acrylate, allylamine and the hydrohalide salts thereof.

The molecular weight of the hydrophilic polymer added to the heat sensitive material is preferably 1,000 or more and 2,000,000 or less, more preferably 5,000 or more and 1,000,000 or less in terms of number-average molecular weight. Conversely, if the molecular weight is too low, the mechanical strength of the heat sensitive layer of the plate material cannot be ensured. If the molecular weight is too high, the viscosity of the heat sensitive material becomes high and thereby it becomes difficult to form a coat on a support by coating the same with the heat sensitive material.

The fine particles which are changed when heated and thereby form an oleophilic area on a plate surface (the oleophilic area forming particles) include, for example, the fine particles consisting of the materials shown below and the microcapsules containing an oleophilic component. The above materials include, for example, (1) polyethylene resins, polystyrene, polypropylene, polyvinyl chloride, polyamide resins and thermoplastic resins such as thermoplastic polyurethanes, (2) wax from animals and plants, (3) petroleum wax.

When the oleophilic area forming particles are some particles other than microcapsules, an oleophilic area is formed on the plate surface by fusing plurality of particles to the plate with heat. When the oleophilic area forming particles are microcapsules containing an oleophilic component (a component forming an oleophilic area), an oleophilic area is formed on the plate surface by allowing the oleophilic component to come out from the microcapsules with heat. When the capsule shell of the microcapsules contains a liquid oleophilic component as a core material, an oleophilic area is formed on the plate surface by making the capsule shell fracture with heat and allowing the oleophilic component to come out from the capsules.

When using microcapsules containing a oleophilic component as the oleophilic area forming particles, the thermal energy required during the course of plate making can be held down compared with the case where some fine particles other than microcapsules are used. Accordingly, microcapsules containing an oleophilic component are preferably used as the oleophilic area forming particles. Further, the use of the microcapsules allows setting of the threshold energy during the course of plate making.

As for the particle diameter of the oleophilic area forming particles, those of average diameter 10 $\mu$m or less are preferably used, and for high resolution use, those of average diameter 5 $\mu$m or less are preferably used. The smaller the particle diameter of the oleophilic area forming particles is, the more preferably the oleophilic area forming particles are used; however, taking into account the handleability of the particles, those of average diameter 0.01 $\mu$m or more are preferably used.

Further, when the oleophilic area forming particles are microcapsules containing an oleophilic component, preferably the above oleophilic component is composed of reactive functional groups. The oleophilic component composed of reactive functional groups enhance the plate durability of the oleophilic area used in the lithography.

These reactive functional groups include, for example, hydroxyl group, carboxyl group, amino group, allyl group, vinyl group, methacryloyl group, acryloyl group, thiol group, epoxy group and isocyanate group.

When the oleophilic area forming particles are microcapsules containing an oleophilic component, the microcapsules may contain various additives such as coloring matter, photothermal converting substance, polymerization initiator, polymerization inhibitor and catalyst, as core materials, in addition to the above described oleophilic component, within the range of not deteriorating the effects of the present invention. The capsule shell containing coloring material and/or photothermal converting substance is particularly preferable, since laser beam can be used as a heat source at the time of plate making. Laser platemaking enables smaller image writing. These additives are also described in WO 98/29258 specification etc.

The present invention also provides lithography obtained by using the plate materials of the present invention, the plate materials having the heat sensitive layer consisting of the heat sensitive materials of the present invention or the plate materials prepared in accordance with the method of the present invention and forming an oleophilic area on plate surface by changing the above described fine particles (oleophilic area forming particles) with heat.

Further, the present invention provides precursors of lithography (plate materials for use in lithographic printing) and lithography of (1) to (7) described below.

(1) A precursor of lithography, characterized in that it includes: a recording layer containing fine particles which convert to an image area when heated and a hydrophilic binder polymer which has Lewis base moieties containing nitrogen, oxygen or sulfur and is hardened with a metal oxide; and a support.

(2) The precursor of lithography described in (1), characterized in that the above fine particle is an encapsulized oleophilic component.

(3) The precursor of lithography described in (2), characterized in that the above oleophilic component has reactive functional groups.

(4) The precursor of lithography described in any one of (1) to (3), characterized in that the above metal oxide has an average primary particle diameter 1 μ or less and its primary particles are dispersed without forming higher-order particles, or the higher-order particles formed of the primary particles have a particle diameter 1 μ or less and are substantially out of contact with each other.

(5) The precursor of lithography described in any one of (1) to (4), characterized in that the above metal oxide is at least one or more types of compounds selected from the group consisting of silicon dioxide, aluminium oxide, titanium oxide, zirconium oxide, zinc oxide, manganese dioxide, tin oxide, titanium peroxide.

(6) A lithography including a support and a recording layer which is formed on the above support and has an oleophilic image area and a hydrophilic non-image area printed in heat mode, characterized in that the above recording layer contains a hydrophilic binder polymer having Lewis base moieties which contain nitrogen, oxygen or sulfur and the above hydrophilic binder polymer is hardened with a metal oxide.

(7) A lithography, characterized in that it is obtained by printing the precursor of lithography described in any one of (1) to (5) in heat mode.

Further, the present invention provides precursors of lithography (plate materials for use in lithographic printing) and lithography of (11) to (18) described below.

(11) A precursor of lithography including: a support; and a recording layer (heat sensitive layer) which is formed on the above support and contains a hydrophilic binder polymer having Lewis base moieties containing nitrogen, oxygen or sulfur and fine particles converting to an image area when heated, characterized in that the above hydrophilic binder polymer is hardened via the alternating bond of silicon atoms and oxygen atoms.

(12) The precursor of lithography described in (11), characterized in that the above fine particle is an encapsulized oleophilic component.

(13) The precursor of lithography described in (12), characterized in that the above oleophilic component has reactive functional groups.

(14) The precursor of lithography described in any one of (11) to (13), characterized in that both of the above bond of silicon atoms and oxygen atoms and the polymer component as a protective agent exist on the plate surface.

In this precursor of lithography (heat sensitive type plate material for use in making lithography), the process for allowing the recording layer (heat sensitive layer) to contain a protective agent is, for example, as follows:

An aqueous solution of the hydrophilic polymer which is to be contained as a protective agent and an aqueous solution of an alkali metal salt of silicic acid (sodium silicate, lithium silicate or potassium silicate) are allowed to penetrate into the heat sensitive layer surface separately or in the form of a mixed aqueous solution (or an organic solvent solution). The processes for allowing these solutions to penetrate into the heat sensitive layer surface include, for example, coating the heat sensitive layer surface with these solution using a bar coater or a blade coater, spraying the same with these solution using an atomizer and immersing the heat sensitive layer in the above solutions.

In this case, the pH value of the aqueous solution containing an alkali metal salt of silicic acid is preferably 7 or more in order for the silicate to stably exist in the solution without separating out, more preferably 8 or more and 11 or less.

(15) The precursor of lithography described in any one of (11) to (14), characterized in that the above bond of silicon atoms and oxygen atoms is formed by the silicate which includes at least one or more types of compounds of lithium silicate, sodium silicate and potassium silicate.

(16) The precursor of lithography described in any one of (11) to (15), characterized in that the above bond of silicon atoms and oxygen atoms is formed via at least one or more types of metal oxides selected from the group consisting of aluminium oxide, titanium oxide, zirconium oxide, zinc oxide, manganese dioxide, tin oxide, titanium peroxide, magnesium oxide, iron oxide, molybdenum oxide, germanium oxide, vanadium oxide, antimony oxide and tungsten oxide.

(17) A lithography including: a support; and a recording layer formed on the above support which has an oleophilic image area and a hydrophilic non-image area printed in heat mode, characterized in that in the above recording layer, a hydrophilic binder polymer having Lewis base moieties which contain nitrogen, oxygen or sulfur is hardened by the bond of silicon atoms and oxygen atoms.

(18) A lithography, characterized in that it is obtained by printing the precursor of lithography described in any one of (11) to (16) in heat mode.

BEST MODE FOR CARRYING OUT THE INVENTION

Figure 1:
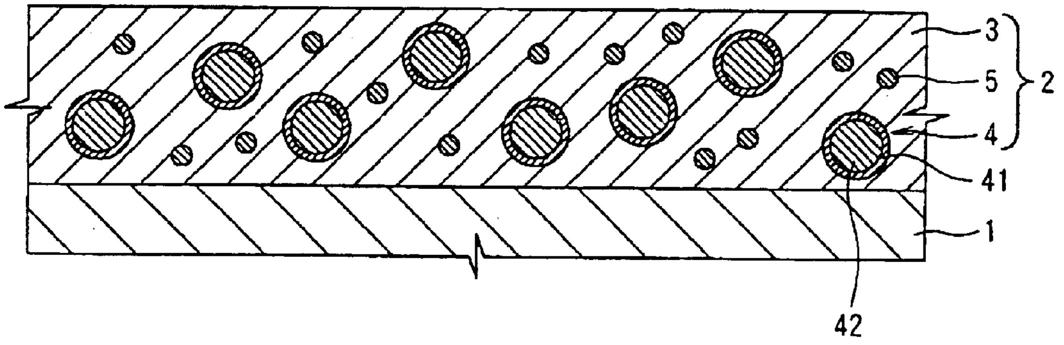
FIG. 1 is a cross-sectional view of one example of the heat sensitive type plate materials for use in making lithography embodying the present invention, the plate material corresponding to the first plate material.
Figure 2:
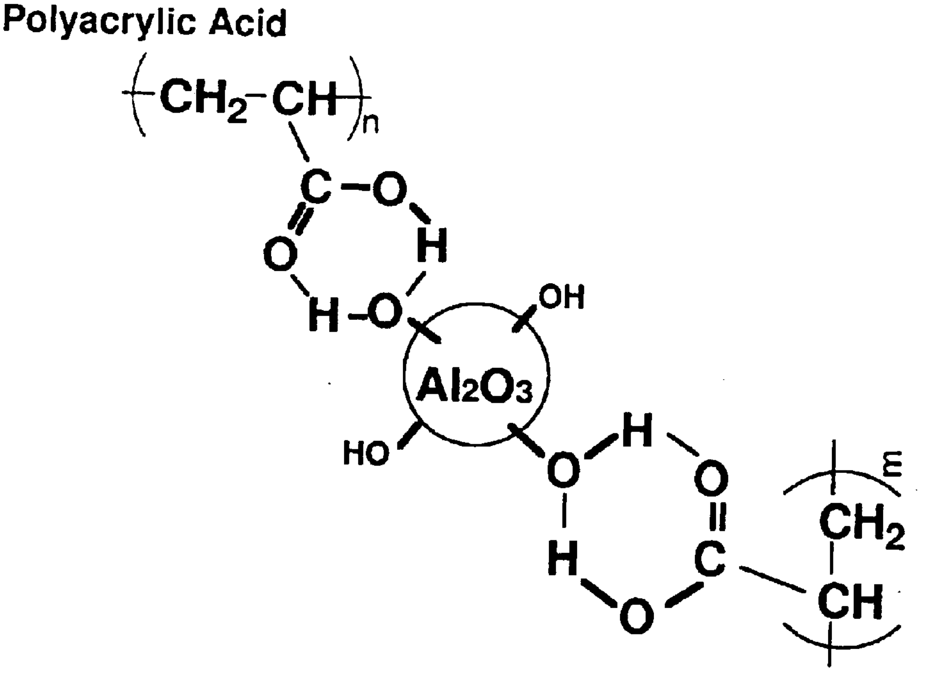
FIG. 2 illustrates the mechanism of obtaining the effects of the first plate material, as an example of the heat sensitive type plate material for use in making lithography in accordance with the present invention, wherein the hydrophilic polymer having Lewis base moieties is polyacrylic acid and the polyvalent metal oxide is aluminium oxide ($Al_2O_3$) particles.
Figure 3:
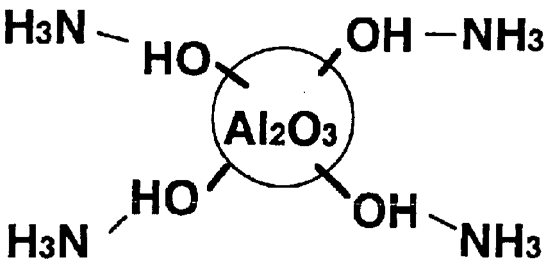
FIG. 3 illustrates the presumptive state of the heat sensitive type plate material for use in making lithography in accordance with the present invention in which the polyvalent metal oxide is stabilized with a stabilizer, wherein the polyvalent metal oxide is aluminium oxide ($Al_2O_3$) and the stabilizer is ammonia.
Figure 4:
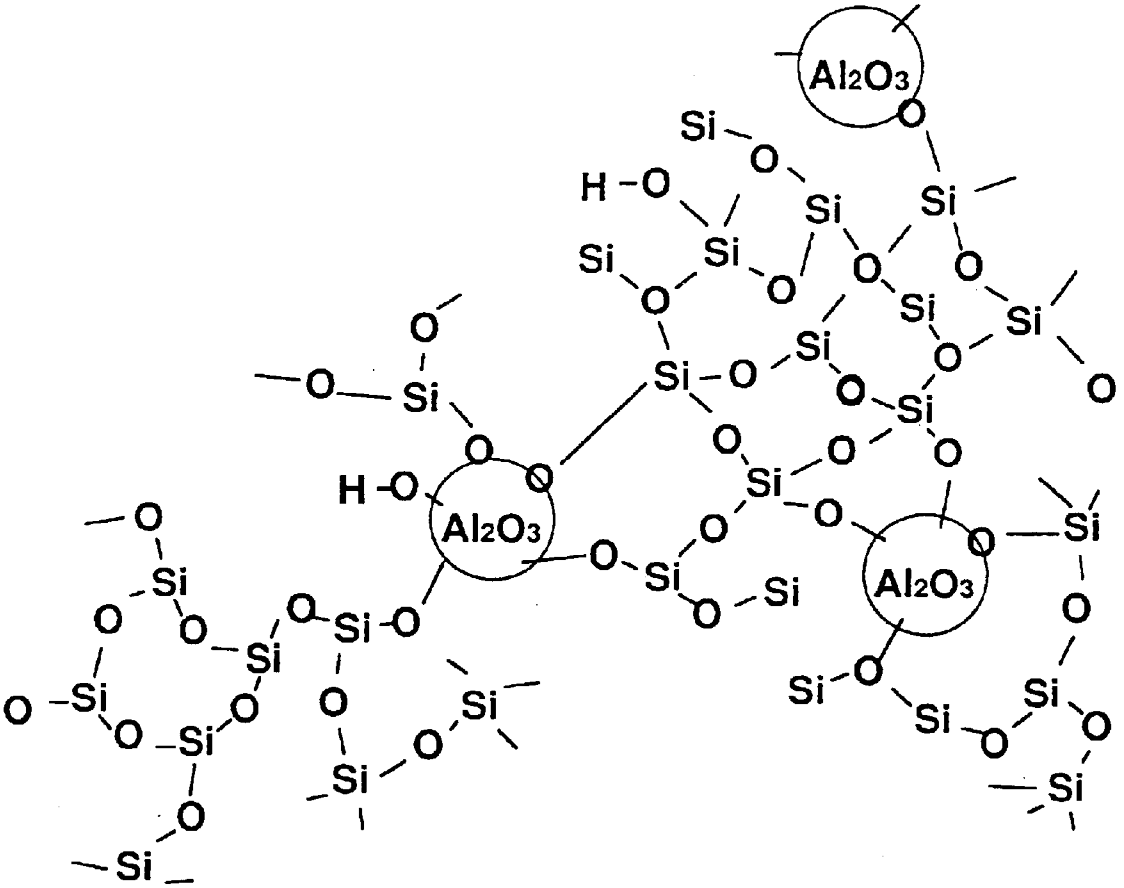
FIG. 4 illustrates the mechanism of obtaining the effects of the third plate material, as an example of the heat sensitive type plate material for use in making lithography in accordance with the present invention, wherein the polyvalent metal oxide is aluminium oxide ($Al_2O_3$) particles.

In the following, the embodiments of the present invention will be described taking both concrete examples and comparative examples.

Preparation of Plate Material (No. 1)

(1) Preparation of Microcapsules Containing an Oleophilic Component (a Component Changed when Heated and thereby Forming an Oleophilic Area on a Plate Surfacee)

An oleophilic component was prepared by dissolving 4.24 g of adduct having tolylene diisocyanate to trimethylolpropane ratio (molar ratio) of 3:1 (manufactured by Nippon Polyurethane Industry Co., Ltd. Brand name: Colonate L, containing 25% by mass ethyl acetate), as a microcapsule shell forming material, 1.12 g of trimethylolpropane triacrylate (manufactured by Kyoei Sya Chemical, Ltd.) and 0.93 g of near infrared ray absorption coloring matter (manufactured by Nippon Kayaku Co., Ltd., "Kayasorb IR-820B") in 21.7 g of glycidyl methacrylate uniformly.

Then a water phase was prepared by dissolving 3.6 g of propylene glycol alginate ester (manufactured by Kibun Food Chemifa Co., Ltd., "Ducklloid LF", number average molecular weight: $2\times10^5$), as a protective colloid, and 2.91 g of polyethylene glycol (manufactured by Sanyo Chemical Industries, Ltd., "PEG 400"), as a microcapsule wall forming material, in 116.4 g of purified water.

The above oleophilic component and water phase were mixed using a homogenizer at rotation speed of 6000 rpm at room temperature to be emulsified. Then the emulsion dispersion together with the container was put into a water bath heated at 60° C. and agitated at rotation speed of 500 rpm for 3 hours. Thus, a dispersion of microcapsules of average particle diameter 2 $\mu$m (MC-A) in water was obtained.

The microcapsules (MC-A) contain glycidyl methacrylate and trimethylolpropane triacrylate, as oleophilic components (oleophilic area forming components), and near infrared ray absorption coloring matter, as coloring matter, inside the capsule. The particle size of the microcapsules was determined with a particle size distribution analyzer "HORIBA LA910" manufactured by Horiba, Ltd.

Then, as the refining processing, the obtained microcapsule dispersion was centrifuged to remove the components other than the microcapsules contained in the dispersion (the oil components not having been taken in the microcapsules, the residue of the microcapsule shell forming material, the protective colloid, etc.) and then water washing of the microcapsule dispersion was repeated three times. The microcapsule concentration of the microcapsule dispersion obtained after the refining processing was 6.5% by mass.

(2) Synthesis of Hydrophilic Polymer 248.5 g of acrylic acid and 2000 g of toluene were taken in a separable flask, and a toluene solution of azobisisobutyronitrile (hereinafter referred to as "AIBN" for short) prepared separately was added dropwise slowly while agitating the flask's contents at room temperature. The toluene solution was obtained by dissolving 2.49 g of AIBN in 24.9 g of toluene, and the entire solution was added to the above flask's contents.

Then the flask's contents were heated to 60° C. and agitated for three hours. The polymer formed and precipitated was filtered and the solid content after the filtration was washed with about 2 liters of toluene. After that, the washed polymer was once dried at 80° C. and further dried in a vacuum to the constant weight. Thus, 235 g of primary polymer was obtained. Then, 355 g of distilled water was taken in a newly prepared separable flask and 35.5 g of the above primary polymer was added thereto to dissolve the same in the water.

A liquid consisting of 2.84 g of glycidyl methacrylate, 0.1 g of 2,6-di-t-butyl-p-cresol (hereinafter referred to as "BHT" for short) and 1 g of triethylbenzylammonium chloride was then added dropwise to the flask's contents from a dropping funnel over 30 minutes. This addition was carried out while allowing dried air to flow into the flask and agitating the contents of the same. After completion of the addition, the flask's contents were slowly heated while agitated, and when having agitated the flask's contents at 80° C. for one hour, they reached a certain acid value.

At this point, the flask's content (polymer) was cooled, and the polymer was isolated in acetone and washed with the acetone while rubbed. Then, the polymer was dried in a vacuum at room temperature to obtain a hydrophilic polymer (BP-A).

The analysis of this hydrophilic polymer by NMR showed that the percentage of glycidyl methacrylate introduced was 2.2%. And the measurement of the molecular weight by GPC showed that the number average molecular weight of this polymer was $6\times10^4$. This polymer had carboxyl groups as Lewis base moieties.

(3) Preparation of Heat Sensitive Material

As a water dispersion containing silicon dioxide particles and ammonia (stabilizer), colloidal silica "SnowTex-N" manufacture by Nissan Chemical Industries, Ltd. was prepared. This colloidal silica contained 20% by mass silicon dioxide (silicic acid anhydride) and ammonia was added thereto to prevent the silicon dioxide particles from adhering to each other.

56 g of this colloidal silica, 100 g of 5% by mass aqueous solution of the polymer (BP-A) obtained in the step (2) and 137 g of microcapsule (MC-A) dispersion (of microcapsule concentration 6.5% by mass) obtained in the step (1) were taken in a prescribed container. The contents of this container were agitated at 200 rpm for one hour with a three-one-motor (manufactured by SHINTO Scientific Co., Ltd. "BL 600") and an agitating blade (manufactured by SUS, anchor-shaped, 10 cm wide).

Thus, a liquid heat sensitive material was obtained which contained microcapsules containing an oleophilic component (oleophilic area forming particles), silicon dioxide (polyvalent metal oxide) in the form of particles, ammonia (stabilizer), a hydrophilic polymer having Lewis base moieties and water.

(4) Formation of Heat Sensitive Layer

An aluminium plate (310 mm×458 mm) 0.24 mm thick which had been subjected to anodizing was prepared as a support. The surface of this support was coated with the above heat sensitive material using a bar coater (rod number 20) to form a coat. The support with a coat formed thereon was held in the atmosphere at 100° C. for 10 minutes, whereby water and ammonia (stabilizer) contained in the coat was evaporated.

Then, 0.5% by mass aqueous solution of a polymer, which was obtained by modifying 60% by mol carboxyl groups of polyacrylic acid (manufactured by Nippon Pure Chemical, Ltd., "Julimer AC10P", number average molecular weight: $5\times10^3$) with sodium, was prepared as a treatment liquid. This treatment liquid contained the above polymer as a protective agent to prevent the adhesion of dirt on the plate material surface as well as to stabilize the hydrophilic area (non-image area) of the plate surface.

The above support with a coat formed thereon was immersed in the treatment liquid for one minute and then it was stood up vertically to be air-dried at room temperature for 24 hours. The thickness of the coat after drying (heat sensitive layer) was 2.5 μm. The measurement of the thickness was made with "Keitaro" manufactured by Seikosha Co., Ltd.

Thus, a plate material No. 1 for use in lithography was obtained which included a support 1 and a heat sensitive layer 2 supported by the support 1, shown as FIG. 1.

The heat sensitive layer 2 consists of a hydrophilic polymer (BP-A) 3, oleophilic area forming particles (microcapsules MC-A) 4 and polyvalent metal oxide (silicon dioxide) particles 5. Each of the oleophilic area forming particles 4 consists of a capsule film 41 and core materials (oleophilic components and coloring matter) 42. The oleophilic area forming particles 4 and the polyvalent metal oxide particles 5 are dispersed in the heat sensitive layer 2 uniformly. And there exists sodium-modified polyacrylic acid, as a protective agent, in the heat sensitive layer of the plate material No. 1 at least in the plate surface side part.

Preparation of Plate Material (No. 2)

(1) Preparation of Heat Sensitive Material

As a water dispersion containing aluminium oxide particles and hydrogen chloride (stabilizer), alumina sol "Alumina Sol 100" manufacture by Nissan Chemical Industries, Ltd. was prepared. This alumina sol contained 10% by mass aluminium oxide particles and hydrogen chloride was added thereto to prevent the aluminium oxide particles from adhering to each other.

150 g of this alumnina sol, 100 g of 5% by mass aqueous solution of a hydrophilic polymer (BP-A) and 137 g of microcapsule (MC-A) dispersion (of microcapsule concentration 6.5% by mass) were taken in a prescribed container. The contents of this container were agitated in the same manner as in the case of plate material No. 1.

Thus, a liquid heat sensitive material was obtained which contained microcapsules containing an oleophilic component (oleophilic area forming particles), aluminium oxide (polyvalent metal oxide) in the form of particles, hydrogen chloride (stabilizer), a hydrophilic polymer having Lewis base moieties and water.

(2) Formation of Heat Sensitive Layer

A heat sensitive layer was formed using this heat sensitive material in the same manner as in the case of plate material No. 1, and treatment using a protective agent was carried out in the same manner as in the case of plate material No. 1, whereby a plate material No. 2 for use in lithography was obtained which had a structure shown in FIG. 1. The hydrogen chloride (stabilizer) contained in the coat was satisfactorily removed at the time of the coat drying carried out during the course of the heat sensitive layer formation under the same drying conditions as the case of plate material No. 1.

The heat sensitive layer 2 consists of a hydrophilic polymer (BP-A) 3, oleophilic area forming particles (microcapsules MC-A) 4 and polyvalent metal oxide (aluminium oxide) particles 5. And there exists sodium-modified polyacrylic acid, as a protective agent, in the heat sensitive layer at least in the plate surface side part.

Preparation of Plate Material (No. 3)

(1) Preparation of Heat Sensitive Material 100 g of 5% by mass aqueous solution of a hydrophilic polymer (BP-A) and 112 g of microcapsule (MC-A) dispersion (of microcapsule concentration 6.5% by mass) were taken in a prescribed container. The contents of this container were agitated in the same manner as in the case of plate material No. 1.

Thus, a liquid heat sensitive material was obtained which contained microcapsules containing an oleophilic component (oleophilic area forming particles), a hydrophilic polymer having Lewis base moieties and water.

(2) Formation of Heat Sensitive Layer

A coat was formed on the surface of the same support as that of the plate material No. 1 by coating the same with this heat sensitive material using a bar coater (rod number 20). The coat was air-dried at room temperature overnight to evaporate the water contained therein.

The coat was impregnated with a liquid (sol), which is dispersion of aluminium oxide particles in water. As the aluminium oxide sol, used was "AlumiSol-10" manufactured by Kawaken Fine Chemical Co., Ltd. The average particle diameter of the aluminium oxide particles contained in this sol is 2 to 20 nm. After immersing in 1.5 liters of the sol for one minute, the above coat was water washed with one liter of purified water (manufactured by Wako Pure Chemical Industries, Ltd.) for 30 seconds.

Thus, aluminium oxide particles were added into the coat consisting of the hydrophilic polymer (BP-A) and the oleophilic area forming particles in the dispersed state.

The coat was treated using a protective agent in the same manner as in the case of plate material No. 1, whereby a plate material No. 3 for use in lithography was obtained which had a structure shown in FIG. 1.

The heat sensitive layer 2 of this plate material consists of a hydrophilic polymer (BP-A) 3, oleophilic area forming particles (microcapsules MC-A) 4 and polyvalent metal oxide (aluminium oxide) particles 5. And there exists sodium-modified polyacrylic acid, as a protective agent, in the heat sensitive layer at least in the plate surface side part.

The thickness of the obtained heat sensitive layer was 2.5 μm. And the aluminium oxide particles dispersed in the heat sensitive layer were 90 nm or less in particle diameter. In other words, aluminium oxide particles were dispersed in the heat sensitive layer in the fine particle state. The particle diameter of the aluminium oxide particles in the heat sensitive layer was determined with an electron microscope "S-2700" manufactured by Hitachi, Ltd. by observing under acceleration voltage of 5 kV.

Preparation of Plate Material (No. 4)

A coat was formed on the surface of the same support as that of the plate material No. 1 by coating the same with the same heat sensitive material as No. 3 using a bar coater (rod number 20) and then it was air-dried at room temperature overnight to evaporate the water contained therein.

The coat was impregnated with water dispersion containing silicon dioxide particles and aluminium oxide particles.

As the water dispersion, used was "Ludox 130M" manufactured by E.I. du Pont de Nemours & Co., Wilmington, Del. The average particle diameter of the silicon dioxide particles and the aluminium oxide particles contained in this water dispersion is 13 to 15 nm.

After immersing in a liquid obtained by diluting the water dispersion to give a solid content (polyvalent metal oxide particles) concentration of 1% by mass for 3 minutes, the above coat was water washed with one liter of purified water (manufactured by Wako Pure Chemical Industries, Ltd.) for 30 seconds.

Thus, silicon dioxide particles and aluminium oxide particles were added within the coat consisting of the hydrophilic polymer (BP-A) and the oleophilic area forming particles (microcapsules containing an oleophilic component) in the dispersed state.

Then the support with the coat formed thereon was immersed in 1% by mass aqueous solution of sodium silicate for 3 minutes and then it was stood up vertically to be air-dried at room temperature for 24 hours.

Thus, a plate material including: a support; and a heat sensitive layer formed on the support which contained the hydrophilic polymer (BP-A) having Lewis base moieties, the oleophilic area forming particles (microcapsules MC-A), silicon dioxide particles, aluminium oxide particles, and a substance A (a substance formed of molecules having a bond expressed by the chemical formula $(SiO_2)_n$) was obtained as a plate material No. 4 for use in lithography.

The thickness of the obtained heat sensitive layer was 2.3 μm. And the silicon dioxide particles and the aluminium oxide particles dispersed in the heat sensitive layer were 90 nm or less in particle diameter. In other words, silicon dioxide particles and aluminium oxide particles were dispersed in the heat sensitive layer in the fine particle state.

Preparation of Plate Material (No. 5)

A coat was formed on the surface of the same support as that of the plate material No. 1 by coating the same with the same heat sensitive material as No. 3 using a bar coater (rod number 20) and then it was air-dried at room temperature overnight to evaporate the water contained therein. The coat was impregnated with an aqueous solution of titanium peroxide as a polyvalent metal oxide in the form of particles. This aqueous solution was prepared as follows.

First, 100 g of 30% aqueous hydrogen peroxide was added dropwise slowly to 0.2% by mol aqueous solution of titanium(IV) sulfate while ice-cooling the aqueous solution. Then the aqueous solution was agitated at room temperature for 18 hours, to obtain a yellow solution. After preserving the solution at room temperature for 10 days, hydrogen peroxide was removed from the solution to obtain an aqueous solution of titanium peroxide.

After immersing in this aqueous solution of titanium peroxide for 3 minutes, the above coat was water washed with one liter of purified water (manufactured by Wako Pure Chemical Industries, Ltd.) for 30 seconds. Thus, titanium peroxide particles were added within the coat consisting of a hydrophilic polymer (BP-A) and oleophilic area forming particles (microcapsules containing an oleophilic component) in the dispersed state.

Then, the coat was treated using a protective agent in the same manner as in the case of plate material No. 1, whereby a plate material No. 5 for use in lithography was obtained which had a structure shown in FIG. 1.

The heat sensitive layer 2 of this plate material consists of a hydrophilic polymer (BP-A) 3, oleophilic area forming particles (microcapsules MC-A) 4 and polyvalent metal oxide (titanium peroxide) particles 5. And there existed sodium-modified polyacrylic acid, as a protective agent, in the heat sensitive layer at least in the plate surface side part.

The thickness of the obtained heat sensitive layer was 2.8 μm. And the titanium peroxide particles dispersed in the heat sensitive layer were 50 nm or less in particle diameter. In other words, titanium peroxide particles were dispersed in the heat sensitive layer in the fine particle state.

Preparation of Plate Material (No. 6)

A coat was formed on the surface of the same support as that of the plate material No. 1 by coating the same with the same heat sensitive material as No. 3 using a bar coater (rod number 20) and then it was air-dried at room temperature overnight to evaporate the water contained therein. The support with the coat formed thereon was immersed in 1% by mass aqueous solution of lithium silicate for 3 minutes and then it was stood up vertically to be air-dried at room temperature for 24 hours.

Thus, a plate material including: a support; and a heat sensitive layer formed on the support which contained the hydrophilic polymer (BP-A) having Lewis base moieties, the oleophilic area forming particles (microcapsules MC-A) and a substance A was obtained as a plate material No. 6 for use in lithography. The thickness of the obtained heat sensitive layer was 2.5 μm.

Preparation of Plate Material (No. 7)

(1) Preparation of Heat Sensitive Material

As a hydrophilic polymer, a polymer obtained by modifying 60% by mol carboxyl groups of polyacrylic acid (hereinafter referred to as "PAA" for short, manufactured by Nippon Pure Chemical, Ltd., "Julimer AC10MP", number average molecular weight: $8\times10^4$) with sodium was prepared.

80.0 g of 10% by mass aqueous solution of this sodium-modified polyacrylic acid, 256 g of microcapsule (MC-A) dispersion and 100 g of 3% by mass aqueous solution of propylene glycol alginate ester (manufactured by Kibun Food Chemifa Co., Ltd., "Ducklloid LF", number average molecular weight: $2\times10^5$) were taken in a prescribed container. The contents of this container were agitated in the same manner as in the case of plate material No. 1.

Propylene glycol alginate ester was added so as to improve the dispersion properties of the microcapsules in the heat sensitive material and make it easier to apply the heat sensitive material on the support.

Thus, a liquid heat sensitive material was obtained which contained oleophilic area forming particles (microcapsules containing an oleophilic component), a hydrophilic polymer having Lewis base moieties and water.

(2) Formation of Heat Sensitive Layer

A coat was formed on the surface of the same support as that of the plate material No. 1 by coating the same with this heat sensitive material using a bar coater (rod number 20). The coat was air-dried at room temperature overnight to evaporate the water contained therein.

Then, the support with the coat formed thereon was immersed in an aqueous solution of alkali salt of silicic acid with a lithium silicate concentration and a sodium silicate concentration of both 0.5% by mass for 3 minutes and then it was stood up vertically to be air-dried at room temperature for 24 hours.

Thus, a plate material including: a support; and a heat sensitive layer formed on the support which contained sodium-modified polyacrylic acid (hydrophilic polymer having Lewis bas moeities), oleophilic area forming particles (microcapsules MC-A) and a substance A was obtained as a plate material No. 7 for use in lithography. The thickness of the heat sensitive material was 2.4 μm.

Preparation of Plate Material (No. 8)

A mixed solution of 25 g of 1.0% by mass aqueous solution of polyacrylic acid (manufactured by Nippon Pure Chemical, Ltd., "Julimer AC10P", number average molecular weight: $5\times10^3$) and 75 g of 1.5% by mass aqueous solution of potassium silicate was prepared as a treatment liquid.

A coat was formed on the surface of the same support as that of the plate material No. 1 by coating the same with the same heat sensitive material as No. 3 using a bar coater (rod number 20) and then it was air-dried at room temperature overnight to evaporate the water contained therein. The support with the coat formed thereon was immersed in the above treatment liquid for 3 minutes and stood up vertically to be dried at 110° C. for 5 minutes.

Thus, a plate material including: a support; and a heat sensitive layer containing the hydrophilic polymer (BP-A) having Lewis base moieties, the oleophilic area forming particles (microcapsules MC-A), the substance A, and polyacrylic acid as a protective agent was obtained as a plate material No. 8 for use in lithography. The thickness of the obtained heat sensitive layer was 2.0 μm.

Preparation of Plate Material (No. 9)

(1) Preparation of Heat Sensitive Material 100 g of 5% by mass aqueous solution of a hydrophilic polymer (BP-A), 112 g of microcapsule (MC-A) dispersion (of microcapsule concentration 6.5% by mass) and 5 g of 25% by mass aqueous solution of lithium silicate were taken in a prescribed container. The contents of this container were agitated in the same manner as in the case of plate material No. 1, except that the agitating duration was 4 hours. Then the contents were subjected to ultrasonic dispersion.

Thus, a liquid heat sensitive material was obtained which contained oleophilic area forming particles (microcapsules containing an oleophilic component), a hydrophilic polymer having Lewis base moieties, lithium silicate and water.

(2) Formation of Heat Sensitive Layer

A coat was formed on the surface of the same support as that of the plate material No. 1 by coating the same with this heat sensitive material, and the support with this coat formed thereon was held in the atmosphere at 110° C. for 3 minutes to evaporate the water contained therein. Then the treatment with a protective agent was carried out in the same manner as in the case of the plate material No. 1.

Thus, a plate material including: a support; and a heat sensitive layer formed on the support which contained the hydrophilic polymer (BP-A) having Lewis base moieties, the oleophilic area forming particles (microcapsules MC-A) and the substance A was obtained as a plate material No. 9 for use in lithography. The thickness of the obtained heat sensitive layer was 2.5 μm. There existed sodium-modified polyacrylic acid, as a protective agent, in this heat sensitive layer at least in the plate surface side part.

Preparation of Plate Material (No. 10)

A coat was formed on the surface of the same support as that of the plate material No. 1 by coating the same with the same heat sensitive material as No. 3 using a bar coater (rod number 20) and then it was air-dried at room temperature overnight to evaporate the water contained therein. Thus, a coat consisting of a hydrophilic polymer (BP-A) and oleophilic area forming particles (microcapsules MC-A) was formed on the support.

Then silicon dioxide particles and aluminium oxide particles were added into the coat in the dispersed state in the same manner as the case of the plate material No. 4. And the treatment with a protective agent was carried out in the same manner as in the case of the plate material No. 1.

Thus, a plate material No. 10 for use in lithography was obtained which had a structure shown in FIG. 1. The heat sensitive layer 2 of this plate material consisted of a hydrophilic polymer (BP-A) 3, oleophilic area forming particles 4 and polyvalent metal oxides in the form of particles (silicon dioxide particles and aluminium oxide particles) 5. And there existed sodium-modified polyacrylic acid, as a protective agent, in this heat sensitive layer at least in the plate surface side part.

The thickness of the obtained heat sensitive layer was 2.5 μm. And the silicon dioxide particles and the aluminium oxide particles dispersed in the heat sensitive layer were 90 nm or less in particle diameter. In other words, the silicon dioxide particles and the aluminium oxide particles were dispersed in the heat sensitive layer in the fine particle state.

Preparation of Plate material (No. 11)

First, a coat was formed on the surface of the same support as that of the plate material No. 1 by coating the same with the same heat sensitive material as No. 7 using a bar coater (rod number 20) and then it was air-dried at room temperature overnight to evaporate the water contained therein.

Then silicon dioxide particles and aluminium oxide particles were added into the coat in the dispersed state in the same manner as the case of the plate material No. 4. And the treatment with a protective agent was carried out in the same manner as in the case of the plate material No. 1.

Thus, a plate material No. 11 for use in lithography was obtained which had a structure shown in FIG. 1. The heat sensitive layer 2 of this plate material consisted of a hydrophilic polymer having Lewis base moieties (sodium-modified polyacrylic acid) 3, oleophilic area forming particles (microcapsules NC-A) 4 and polyvalent metal oxide particles (silicon dioxide particles and aluminium oxide particles) 5. And there existed sodium-modified polyacrylic acid, as a protective agent, in this heat sensitive layer at least in the plate surface side part.

The thickness of the obtained heat sensitive layer was 2.4 μm. And the silicon dioxide particles and the aluminium oxide particles dispersed in the heat sensitive layer were 90 nm or less in particle diameter. In other words, the silicon dioxide particles and the aluminium oxide particles were dispersed in the heat sensitive layer in the fine particle state.

Preparation of Plate Material (No. 12)

(1) Preparation of Heat Sensitive Material

First, as a water dispersion containing tin oxide particles (polyvalent metal oxide in the form of particles), "EPS-6" manufacture by Yamanaka Chemical, Ltd. was prepared. This water dispersion contained 6% by mass colloid particles of tin oxide (average particle diameter 6 nm) and ammonia was added thereto to prevent the tin oxide particles from adhering to each other.

150 g of this water dispersion, 100 g of 5% by mass aqueous solution of a hydrophilic polymer (BP-A) and 112 g of microcapsule (MC-A) dispersion (of microcapsule concentration 6.5% by mass) were taken in a prescribed container. The contents of this container were agitated in the same manner as in the case of plate material No. 1, except that the agitating duration was 4 hours.

Thus, a liquid heat sensitive material was obtained which contained oleophilic area forming particles (microcapsules containing an oleophilic component), tin oxide in the form of particles (polyvalent metal oxide), ammonia (stabilizer), a hydrophilic polymer having Lewis base moieties and water.

(2) Formation of Heat Sensitive Layer

A coat was formed on the surface of the same support as that of the plate material No. 1 by coating the same with this heat sensitive material using a bar coater (rod number 20) and then it was air-dried at room temperature overnight to evaporate the water contained therein. The support with this coat formed thereon was immersed in the treatment liquid described below for 3 minutes, and it was stood up vertically and dried at 110° C. for 5 minutes.

The treatment liquid used was a mixed solution of 25 g of 1.0% by mass aqueous solution of polyacrylic acid (manufactured by Nippon Pure Chemical, Ltd., "Julimer AC10P", number average molecular weight: $5\times10^3$) and 75 g of 1.5% by mass aqueous solution of lithium silicate (Nippon Chemical Industrial Co., Ltd.).

Thus, a plate material including: a support; and a heat sensitive layer formed on the support which contained the hydrophilic polymer (BP-A) having Lewis base moieties, the oleophilic area forming particles (microcapsules MC-A), the substance A, tin oxide in the form of particles (polyvalent metal oxide) and polyacrylic acid as a protective agent was obtained as a plate material No. 12 for use in lithography. The thickness of the obtained heat sensitive layer was 2.0 μm.

Preparation of Plate Material (No. 13)

A treatment liquid was prepared as follows. First, 20 g of 6% by mass aqueous solution of titanium oxide (manufactured by Taki Chemical Co., Ltd., "Tainoc A-6") was added to 70 g of 0.56% by mass aqueous solution of lithium silicate (Nippon Chemical Industrial Co., Ltd.) and agitated for 10 minutes to prepare a mixed solution of lithium silicate and titanium oxide. Then, 6.3 g of 5.0% by mass aqueous solution of polyacrylic acid (manufactured by Nippon Pure Chemical, Ltd., "Julimer AC10P", number average molecular weight: $5\times10^3$) was added dropwise to the mixed solution while agitating the same slowly.

Thus, a mixed solution containing lithium silicate, titanium oxide particles and polyacrylic acid (a protective agent) was obtained.

A coat was formed on the surface of the same support as that of the plate material No. 1 by coating the same with the same heat sensitive material as that of the plate material No. 12 using a bar coater (rod number 20) and then it was air-dried at room temperature overnight to evaporate the water contained therein. The support with this coat formed thereon was immersed in the above treatment liquid for 3 minutes, and it was stood up vertically and dried at 110° C. for 5 minutes.

Thus, a plate material including: a support; and a heat sensitive layer formed on the support which contained the hydrophilic polymer (BP-A) having Lewis base moieties, the oleophilic area forming particles (microcapsules MC-A), the substance A, tin oxide and titanium oxide in the form of particles (polyvalent metal oxide) and polyacrylic acid as a protective agent was obtained as a plate material No. 13 for use in lithography. The thickness of the obtained heat sensitive layer was 2.1 μm.

Preparation of Plate material (No. 14)

(1) Preparation of Heat Sensitive Material 100 g of 5% by mass aqueous solution of a hydrophilic polymer (BP-A) and 112 g of microcapsule (MC-A) dispersion (of microcapsule concentration 6.5% by mass) were taken in a prescribed container. The contents of this container were agitated in the same manner as in the case of plate material No. 1.

Thus, a liquid heat sensitive material was obtained which contained oleophilic area forming particles (microcapsules containing an oleophilic component), a hydrophilic polymer having Lewis base moieties and water.

(2) Formation of Heat Sensitive Layer

A coat was formed on the surface of the same support as that of the plate material No. 1 by coating the same with this heat sensitive material using a bar coater (rod number 20). The coat was air-dried at room temperature overnight to evaporate the water contained therein. The support with this coat formed thereon was referred to as plate material No. 14 for use in lithography. In other words, the heat sensitive layer of the plate material No. 14 consisted of a hydrophilic polymer (BP-A) and oleophilic area forming particles (microcapsules MC-A) and contained none of polyvalent metal oxide in the form of particles, substance A, silicate and protective agent.

Preparation of Plate Material (No. 15)

(1) Preparation of Heat Sensitive Material 5 g of water dispersion containing 20% by mass silicon dioxide particles ("SnowTex XS" manufacture by Nissan Chemical Industries, Ltd.), 0.2 g of silane coupling agent ("TSL 8350" manufactured by Toshiba Silicone Co., Ltd.), 0.4 g of carbon fine particles ("#2600" manufactured by Mitsubishi Chemical Industries Ltd.) and 18.4 g of water were taken in a prescribed container. The contents of this container were agitated in the same manner as in the case of plate material No. 1.

Thus, a liquid heat sensitive material was obtained which contained carbon fine particles as oleophilic area forming particles, a silane coupling agent as an inorganic binder, silicon dioxide particles as polyvalent metal oxide in the form of particles, and water as a solvent.

(2) Formation of Heat Sensitive Layer

A coat was formed on the surface of the same support as that of the plate material No. 1 by coating the same with this heat sensitive material using a bar coater (rod number 20). The coat was air-dried at room temperature overnight to evaporate the water contained therein. The support with this coat formed thereon was referred to as plate material No. 15 for use in lithography. In other words, the heat sensitive layer of the plate material No. 15 consisted of carbon fine particles, a silane coupling agent and silicon dioxide particles.

Making Lithography and Printing

Plate making was carried out by irradiating each of the plate materials Nos. 1 to 15 with the laser beam, which was controlled according to image data, using a laser platemaking system (containing 1 W semiconductor laser device) connected to an electron composition system. The image data used were image patterns formed of 10 mm×10 halftone dots (2, 5, 10, 30, 50, 70, 90, 95, 98, 100% ) and characters (10, 8, 6, 4, 2 point).

Figure 5:
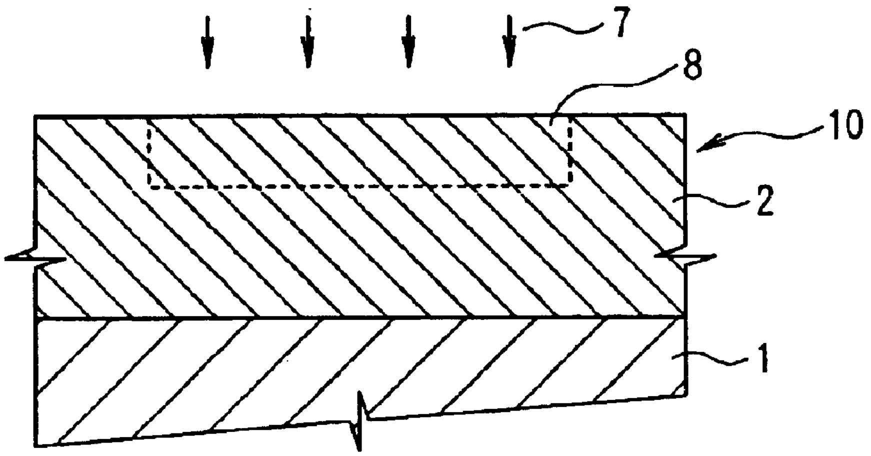
FIGS. 5(*a*) and 5(*b*) illustrate the plate making mechanism when using the plate materials Nos. 1 to 14 which are the embodiments of the present invention described later, FIG. 5(*a*) being a cross-sectional view of the plate materials and FIG. 5(*b*) being a cross-sectional view of the lithography made.
Figure 5:
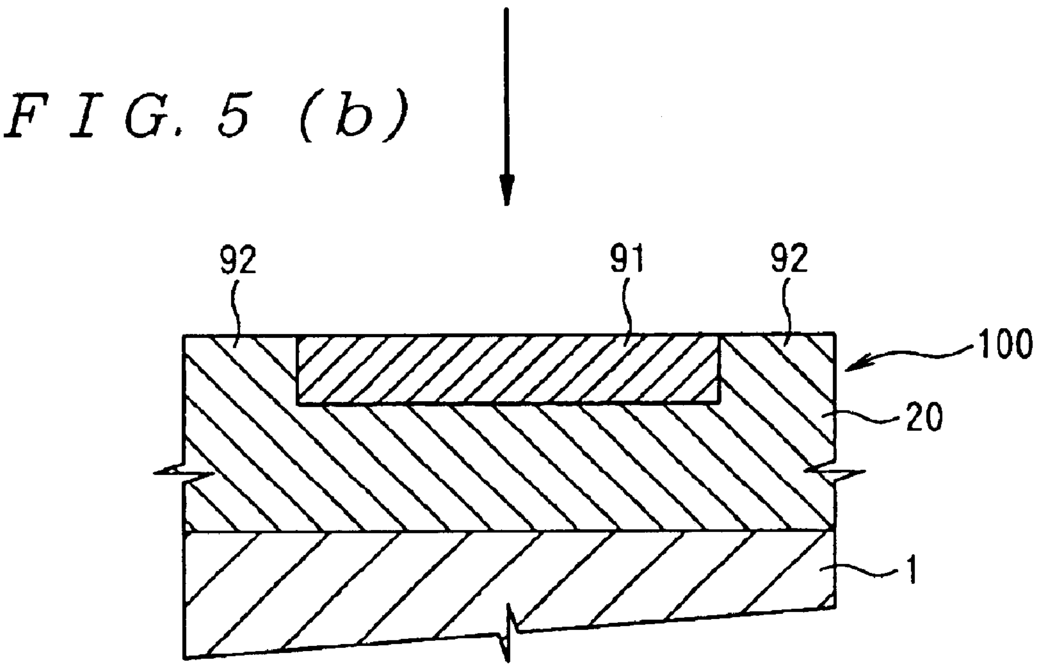

With this plate making method, in the plate materials Nos. 1 to 14, only the area 8 of the heat sensitive layer 2 of the plate material 10, which was irradiated with the laser beam 7, was heated, as shown in FIG. 5(*a*). As a result, an oleophilic area (oil-based-ink receptive area) 91 was formed in the heated area 8 and the rest became a hydrophilic area (non oil-based-ink receptive area) 92 where a hydrophilic polymer existed.

In other words, with the plate materials Nos. 1 to 14, lithography 100, in which an ink receptive area 91 and a non ink receptive area 92 are formed on the plates surfaces according to the image data, can be obtained without the developing processing by irradiating them with the laser beam which is controlled according to the image data. The part of the heat sensitive layer 2 of the plate material 10 becomes the main body 20 of the lithography 100.

This plate making was carried out for all the plate materials under the same conditions.

Hereinafter the plates made of the plate materials Nos. 1 to 15 will be referred to as lithography Nos. 1 to 15. For some plate material No. 13, however, the exposure treatment was carried out in which the surface of the plates made was irradiated with light of 6 $J/cm^2$ using a chemical lamp. Of the lithography made of the plate material No. 13, those having been subjected to the exposure treatment will be referred to as lithography No. 13B and those not having been subjected to the exposure treatment lithography No. 13A.

Each of the plates made (lithography Nos. 1 to 12, 13A, 13B, 14 and 15) was trimmed and mounted on an offset press ("HAMADA VS34II" manufactured by Hamada Printing Press, Ltd.), and printing was done on wood free paper. The printing was done while allowing the pressure between each plate and the bracket to be higher than usual by inserting 2 under-sheets between the plate and the blanket, since the printing was an acceleration test. When doing printing, "GEOS-G" manufactured by Dainippon Ink and Chemicals, Inc. was used as ink and a 100-fold dilution of "EU-3" manufactured by Fuji Photo Film Co., Ltd. was used as dampening water.

Printing using each plate was continued until the plate wear thereof deteriorated. As for the plate wear, the following points were checked every time 100 prints were produced. First, the loss of 5% halftone dots was checked with a magnifying glass of 30 magnifications. Second, whether the images of printed articles were clear or not and the presence of scumming and tinting on the non-image area were judged visually. Third, the density of the solid area was measured with a densitometer ("DM 400" manufactured by Dainippon Screen Mfg. Co., Ltd.)

By doing printing, images are formed in such a manner that first ink is held in the ink receptive area (oleophilic area) on the plate surface and then the ink is pressed against paper via a rubber blanket. The non-image area of printed articles means the area against which the non ink receptive area (hydrophilic area) on the plate surface has been pressed via a rubber blanket in printing.

If the result of measurements revealed that the printed article satisfied the following four points: (1) there was no 5% halftone dot loss, (2) density of solid area was 1.2 or more, (3) the image of the printed article was clear visually, and (4) neither scumming nor tinting was observed on the non-image area visually, the printed article was judged to have a satisfactory printing performance.

As a result, for the printed articles produced using the lithography (Nos. 1 to 5, 10 to 12, 13A and 13B) made of the plate materials Nos. 1 to 5, 10 to 13, even after the number of printed articles produced exceeded 50,000, the deterioration of plate wear could not be observed visually. Further, even after the number of printed articles produced exceeded 50,000, neither stripping (stripping between the plate body 20 and the support 1) nor scratches were observed in the plates visually. Particularly for the printed articles produced using the lithography No. 13B, which underwent the above described exposure treatment, even after the number of printed articles produced exceeded 60,000, the deterioration of plate wear could not be observed and neither stripping nor scratches were observed in the plate.

For the printed articles produced using the lithography (Nos. 6 to 9) made of the plate materials Nos. 6 to 9, even after the number of printed articles produced exceeded 25,000, the deterioration of plate wear could not be observed. Further, even after the number of printed articles produced exceeded 25,000, neither stripping nor scratches were observed visually in the plates. And very few stains were observed on the blanket after 25,000 prints were produced.

On the other hand, for the printed articles produced using the lithography No. 14 made of the plate material No. 14, stripping resulted in the plate when the number of the prints produced was only 100 or so. In addition, scratches easily resulted on the plate surface and therefore much care should be used when handling the plate.

For the printed articles produced using the lithography No. 15 made of the plate material No. 15, scumming and tinting resulted in the non-image area of the printed articles when the number of the prints produced was 1500 or so. At this point, however, neither stripping nor scratches were observed visually in the plate.

Thus, it is apparent from the results mentioned above that the lithography Nos. 1 to 12, 13A and 13B made of the plate materials Nos. 1 to 13, which correspond to the examples of the present invention, have significantly high plate wear, compared with the lithography Nos. 14 and 15 made of the plate materials Nos. 14 and 15, which correspond to the comparative examples of the present invention.

INDUSTRIAL APPLICABILITY

As described so far, according to the present invention, heat sensitive type plate materials for use in making lithography which require no developing processing are provided, the plate materials being characterized in that the lithography made of them are high in mechanical strength and plate wear, in addition, the plate making can be carried out without causing a significant cost rise.

Accordingly, with these plate materials, much care need not be used when handling the lithography, and moreover, even if printing is done under severe conditions, the blanket need not be washed every time a certain number of prints are produced. This leads to improvement in efficiency of printing operation.

Thus, the use of the plate materials of the present invention allows the CTP system, which provides rationalization of plate making process, reduction in plate making duration and reduction in material cost, to be a practical system in the field of commercial printing.

What is claimed is:

1. A heat sensitive type lithography printing plate comprising a heat sensitive layer on a support, the heat sensitive layer containing fine particles which are changed when heated and thereby form an oleophilic area on the plate surface, a hydrophilic polymer consisting essentially of an organic polymer having Lewis base moieties containing oxygen, nitrogen or sulfur and a hardening agent for the hydrophilic polymer, wherein the hardening agent for hydrophilic polymer is a particle of polyvalent metal oxide having an average primary particle diameter of 1 $\mu m$ or less.

2. The heat sensitive type lithography printing plate according to claim 1, wherein said polyvalent metal oxide is at least one selected from the group consisting of silicon dioxide, aluminum oxide, zirconium oxide, zinc oxide, manganese dioxide, tin oxide, titanium oxide, titanium peroxide, magnesium oxide, molybdenum oxide, iron oxide, germanium oxide, vanadium oxide, antimony oxide and tungsten oxide.

3. The heat sensitive type lithography printing plate according to claim 1, wherein said polyvalent metal oxide is at least one selected from the group consisting of silicon dioxide, aluminum oxide and tin oxide.

4. The heat sensitive type lithography printing plate according to claim 1 wherein the hardening agent for hydrophilic polymer is a molecule having an alternating bond of silicon atoms and oxygen atoms.

5. A heat sensitive type lithography printing plate comprising a heat sensitive layer on a support, the heat sensitive layer containing fine particles which are changed when heated and thereby form an oleophilic area on the plate surface, a hydrophilic polymer consisting essentially of an organic polymer having Lewis base moieties containing oxygen, nitrogen or sulfur and a hardening agent for the hydrophilic polymer, wherein the hardening agent for hydrophilic polymer is a molecule having an alternating bond of silicon atoms and oxygen atoms and polyvalent metal oxides.

6. The heat sensitive type lithography printing plate according to claim 5, wherein said average primary particle diameter of the metal oxide particles is 2 μm or less.

7. A heat sensitive type lithography printing plate comprising a heat sensitive layer on a support, the heat sensitive layer containing fine particles which are changed when heated and thereby form an oleophilic area on the plate surface, a hydrophilic polymer consisting essentially of an organic polymer having Lewis base moieties containing oxygen, nitrogen or sulfur and a hardening agent for the hydrophilic polymer, wherein the hardening agent for hydrophilic polymer is silicate.

8. The heat sensitive type lithography printing plate according to claim 7, wherein said silicate contains at least one kind of alkali salt of silicate.

9. The heat sensitive type lithography printing plate according to claim 7 or 8, wherein said heat sensitive type lithography printing plate further contains polyvalent metal oxide as a hardening agent for hydrophilic polymer.

10. A liquid heat sensitive material for use in making a heat sensitive lithography printing plate, comprising fine particles which change when heated and thereby form an oleophilic area on the plate surface, a hydrophilic polymer consisting of an organic polymer having Lewis base moieties containing oxygen, nitrogen or sulfur, a polyvalent metal oxide, a stabilizer for making the polyvalent metal oxide inert to the said hydrophilic polymer, and a solvent.

11. The liquid heat sensitive material for forming a heat sensitive type lithography printing plate according to claim 10, wherein said stabilizer is an acid or a base.

12. A method of manufacturing a heat sensitive type lithography printing plate, comprising forming a heat sensitive layer by excluding stabilizing agent from a coat after a support is coated by a liquid heat sensitive material for forming a heat sensitive lithography printing plate according to claim 10 or 11.

* * * * *